(12) United States Patent
Liu

(10) Patent No.: US 6,486,643 B2
(45) Date of Patent: Nov. 26, 2002

(54) HIGH-EFFICIENCY H-BRIDGE CIRCUIT USING SWITCHED AND LINEAR STAGES

(75) Inventor: Gang Liu, Novi, MI (US)

(73) Assignee: Analog Technologies, Inc., Farmington Hills, MI (US)

( * ) Notice: Subject to any disclaimer, the term of this patent is extended or adjusted under 35 U.S.C. 154(b) by 0 days.

(21) Appl. No.: 09/813,078

(22) Filed: Aug. 27, 2001

(65) Prior Publication Data

US 2002/0089316 A1 Jul. 11, 2002

Related U.S. Application Data

(60) Provisional application No. 60/250,416, filed on Nov. 30, 2000.

(51) Int. Cl.$^7$ ................................................ G05F 1/59
(52) U.S. Cl. ........................ 323/268; 323/274; 323/284
(58) Field of Search ................................ 323/268, 274, 323/284, 350

(56) References Cited

U.S. PATENT DOCUMENTS

| | | | | |
|---|---|---|---|---|
| 4,502,152 A | * | 12/1985 | Sinclair | 323/268 |
| 4,893,228 A | | 1/1990 | Orrick et al. | 363/89 |
| 5,034,676 A | * | 7/1991 | Kinzalow | 323/274 |
| 5,083,078 A | * | 1/1992 | Kubler et al. | 323/268 |
| 5,309,082 A | | 5/1994 | Payne | 323/270 |
| 5,329,245 A | | 7/1994 | Hammond et al. | 330/251 |
| 5,414,341 A | * | 5/1995 | Brown | 323/268 |
| 5,450,727 A | | 9/1995 | Ramierez et al. | 62/3.7 |
| 5,479,337 A | | 12/1995 | Voigt | 363/131 |
| 5,629,608 A | * | 5/1997 | Budelman | 323/284 |
| 5,689,958 A | | 11/1997 | Gaddis et al. | 62/3.7 |
| 5,838,515 A | | 11/1998 | Mortazavi et al. | 360/78.12 |
| 5,886,484 A | | 3/1999 | Fucili et al. | 318/254 |
| 5,905,407 A | | 5/1999 | Midya | 330/10 |
| 6,023,143 A | | 2/2000 | Salina et al. | 318/599 |
| 6,091,292 A | | 7/2000 | Higashiyama | 330/10 |
| 6,097,249 A | | 8/2000 | Strickland et al. | 330/10 |
| 6,127,885 A | | 10/2000 | Colangelo | 330/10 |
| 6,147,545 A | | 11/2000 | Marshall | 327/424 |
| 6,160,445 A | | 12/2000 | Schweighofer | 330/10 |
| 6,166,596 A | | 12/2000 | Higashiyama et al. | 330/10 |

OTHER PUBLICATIONS

Intersil Corporation Application Note entitled "Class–D Audio II Evaluation Board (HIP4080AEVAL2)" by George E. Danz dated Mar., 1996 (11 pages).
Intersil Corporation Technical Paper entitled "HIP4080, 80V High Frequency H–Bridge Driver" by George E. Danz dated Nov., 1996 (16 pages).

(List continued on next page.)

Primary Examiner—Jeffrey Sterrett
(74) Attorney, Agent, or Firm—Robert S. Nolan; Cantor Colburn LLP

(57) ABSTRACT

An H bridge regulating system for driving an electric load includes a linear output stage and switch mode output stage connected to opposite ends of the load. The linear output stage has a linear mode amplifier and a feedback circuit, and its amplifier generates a first output signal tied to one end of the load. This output voltage is passed through a conditioning resistor to an inverting input of the linear mode amplifier. The switch mode output stage has a switch mode amplifier and a feedback circuit, and its amplifier generates a second output signal tied to the other end of the load. Its voltage signal is passed through a second conditioning resistor to an inverting input of the switch mode amplifier. Other feedback circuit elements are also provided to create three distinct regions of operations for each of the amplifiers. Due to this novel arrangement for an H bridge circuit, and this novel method of operation involving three distinct regions of operation for the linear mode and switch mode output stages, very high power-saving energy efficiencies are achieved. In addition, H bridge systems for three terminal electrical devices such as three-phase electric motors are disclosed.

48 Claims, 7 Drawing Sheets

OTHER PUBLICATIONS

Allegro MicroSystems, Inc. Technical Paper STP97–5A entitled "Monolithic, Programmable, Full–Bridge Motor Driver Integrates PWM Current Control and 'Mixed–Mode' Microstepping" by Paul Emerald, Roger Peppiette and Anatol Seliverstov presented 10/97 (12 pages).

ST Microelectrics, Inc. Technical Paper TDA7480 entitled "10W Mono Class–D Amplifier" dated Sep., 1998 (10 pages).

Allegro MicroSystems, Inc. Technical Paper STP 98–9 entitled "A New, Low–Cost Dual H–Bridge Motor–Driver IC" by Thomas Truax and Robert Stoddard presented Nov., 1998 (10 pages).

Unitrode Design Note DN–76 entitled "Closed Loop Temperature Regulation Using the UC3638 H–Bridge Motor Controller and a Thermoelectric Cooler" by David Salerno dated Feb., 1999 (4 pages).

Apex Microtechnology Corporation Paper entitled "Pulse Width Modulation Amplifier SA08" dated May, 1999 (4 pages).

Microsemi Issue Article entitled "LX1720: AudioMAX High–Efficiency Class–D Amplifier" dated Summer, 1999 (2 pages).

Texas Instruments Application Report entitled "Design Considerations for Class–D Audio Power Amplifiers" by Richard Palmer dated Aug., 1999 (27 pages).

Microsemi Business News Release entitled "Microsemi Corps.'s Linfinity Division Expands Audio Lineup With New Class D Amplifier Controller Chip" dated Aug., 1999 (3 pages).

LinFinity Microelectronics Inc. Production Data Sheet entitled "Switching Class–De, Stereo Power Amplifier Controller IC" dated Sep., 1999 (6 pages).

Allegro MicroSystems, Inc. Technical Paper STP 99–12 entitled "A New Serial–Controlled Motor–Driver IC" by Thomas Truax and Robert Stoddard, presented Nov., 1999 (11 pages).

Technical Paper entitled "TMS329C67–Based Design of a Digital Audio Power Amplifier Introducing Novel Feedback Strategy" by Erik Bresch and Wayne T. Padgett, undated (16 pages).

Technical Paper entitled "Power Dissipation in Linear Audio Power Amplifiers" by Paul Nossaman, undated (21 pages).

Allegro MicroSystems, Inc. Data Sheet 29319.4 entitled "3951 Full–Bridge PWM Motor Driver", undated (12 pages).

* cited by examiner

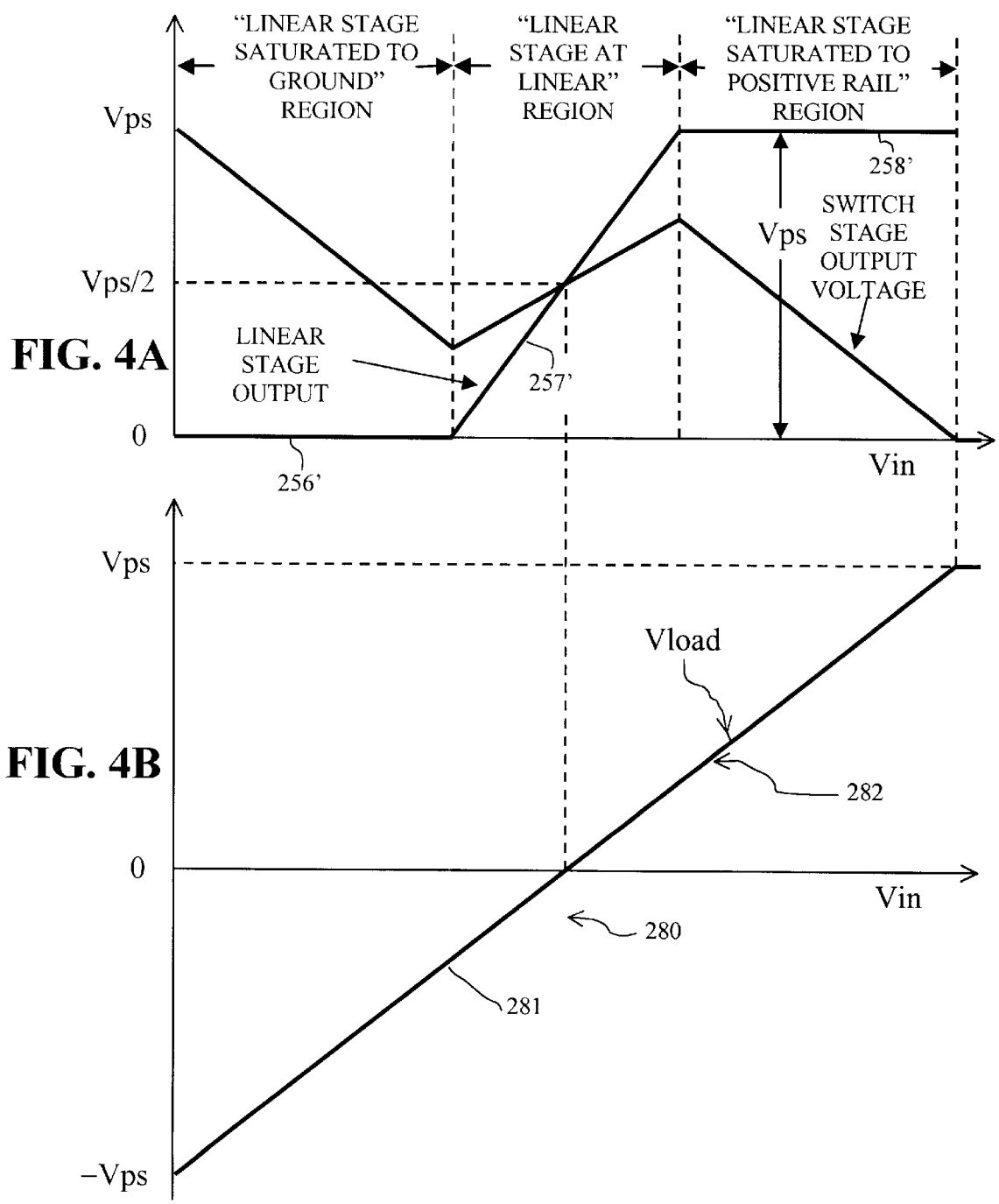

HIGH-EFFICIENCY H-BRIDGE CIRCUIT USING SWITCHED AND LINEAR STAGES

CROSS-REFERENCE TO RELATED APPLICATION

This application claims priority to U.S. provisional patent application Ser. No. 60/250,416 filed Nov. 30, 2000 by the same inventor and entitled "High-Efficiency H-Bridge Using One Linear and One Switch Mode Output", the entire specification of which is incorporated herein by reference.

BACKGROUND OF THE INVENTION

1. Technical Field

The present invention relates generally to H-bridge systems and methods for driving electric loads, and more particularly to high-efficiency H-bridge regulating circuits and methods for driving an electric load such as a thermoelectric cooler (TEC) by using a linear amplifier to drive one end of the load and a switching amplifier to drive the other end of the load.

2. Discussion

In virtually every modern fiber-optic network, there are lasers and TECs. The TECs are required since the laser outputs are highly sensitive to temperature fluctuations. Therefore, at every point in the network where there is a laser beam generating device, such as a laser diode, or where there is a component which has the possibility of undesirable thermal expansion that would adversely impact performance of the network, a thermoelectric cooler is typically employed. For example, in the typical fiber-optic cable system, there may be dozens of laser beams which are all focused together onto a single optical fiber. In addition, a single cable may have several optical fibers running in it. At the locations where these multiple beams come together and are focused into one or several optical fibers in a single cable, there typically is also one or more thermoelectric coolers. These TECs are used to stabilize the temperature of the laser diodes and of other temperature-sensitive components. In addition, the fiber-optic cables may run for a few kilometers, or dozens, hundreds or thousands of kilometers. Because of optical beam attenuation by the fiber, repeater optical amplifiers are used to reamplify the optical beam and send it on its way along the optical fiber cable. Each repeater amplifier includes at least one diode laser as an optical power source and typically utilizes at least one TEC.

In various optical fiber cable installations, there are typically multiple diode lasers which generate the laser beams. To ensure highly stable operation, the each of the laser diodes is rigorously temperature-controlled, typically by a closed-loop controller having a TEC which has a thermistor or other heat-sensing device mounted on it. Some systems rely on sensing the wavelength of the laser beam for sensing and stabilizing the laser diode temperature.

As is well-known, to operate the TECs for the purpose of stabilizing the temperature with any precision requires a power control circuit to regulate the direction and magnitude of the electric current applied across the TEC. The control portion of the overall circuit, not including the power amplifiers to which the TEC is connected, may be very small and draw very little power. But typical maximum power requirements for driving a TEC in applications such as stabilizing the temperature of diode lasers, depending on the size of the TEC, are 1 amp at 2 volts (which equals 2 watts), 2.5 amps at 2.5 volts (which equals 7.5 watts), or 3.5 amps at 3.5 volts (which equals 12.25 watts).

As is well-known, TECs are solid-state heat pumps. They are usually configured as relatively small flat box-like devices and operate when a DC current is passed through the Peltier elements in them. They typically are two-wire devices that have two flat ceramic plates (e.g., top and bottom sides) which serve as the heat sinks, with Peltier elements sandwiched therebetween. Typically, one plate or side is used as the temperature-stabilized side, on which a device, such as a laser diode, is mounted. That side is normally called the cold side, since heat from this side is usually being removed by the TEC. In some cases, like a cold start-up or where the set point is above the ambient temperature, heat may be pumped to this side by the TEC. A TEC transfers heat from one plate or side to the other, using the Peltier effect, with the direction of heat transfer being dependent upon the direction of the current. So, TECs can be used for heating or cooling and the magnitude of the current controls the amount of heat transfer.

Solid-state devices, like thermistors, mounted to one side of the TEC, provide a reliable indication of temperature and/or temperature variation on that side. The other plate or side to which heat is dumped (the heated plate) typically does not need to be controlled—often the heat is simply dumped into the environment. When using thermistors as a temperature feedback device, conventional power control circuits for TEC units can stabilize temperature on the cold side or plate of the TEC to about ±0.0001 degree C. relative stability to a set-point temperature. The relative stability of the temperature required is often ±0.1° C. to ±1° C. for the laser diodes used in fiber optic network applications. In some other cases, such as diode pumped lasers, the temperature stability required may be ±0.01° C. or even ±0.001° C. The size of TECs can be from 1 millimeter (mm) by 2 mm to 90 mm by 90 or more, with the height being from 2 mm to 6 mm or more. The size of the TECs often used in fiber-optic network applications typically varies from about 2 millimeters (mm) by 2 mm up to about 20 mm by 20 mm, with the height of the TECs typically being in the range of 2.5 mm to about 5 mm.

It is common today to use reasonably precise linear amplifiers to operate or drive TECs. Such linear mode TEC controllers are of low efficiency, often 20% to 40% efficient at most. The other 80% to 60% of the power applied to the linear amplifier drivers becomes waste heat which must be dumped to the ambient environment or otherwise removed. When many of these low efficiency TEC controllers are used in a single location, such as within a small enclosure, it is like having many multi-watt light bulbs burning inside that enclosure. This heat load in turn must be removed by appropriate types of heat removal systems, including fans, air-cooled or liquid-cooled heat sinks and/or air conditioning systems. These heat removal systems are an integral part of, and add significantly to the electric utility costs of operating, fiber-optic network equipment. Further, individual hot spots within such TEC-laden controller enclosures are another source of problems. The hot spots occur more often when the TECs are deployed in stacked configurations, since one TEC often transfers its heat to another TEC in the stack. Further, excess heat generally contributes to with long-term temperature stability problems. As is well known, the performance of the power supplies and/or control circuits can degrade due to excess heat over long periods of time, such as three to five or more years, which reduces fiber-optic network stability and/or performance.

Linear mode amplifiers have long been known to have the two major related drawbacks, namely low efficiency and the generation of unwanted heat, which, as noted, can induce long-term stability problems. But, linear mode amplifiers have long been recognized as having their benefits as well, including low cost due to a small number of required components, and very low noise production since they operate linearly.

Another benefit is that linear amplifiers take up less printed circuit board space, because they use a fewer number of components, and because the components used are typically smaller in size. For example, virtually all switch mode amplifiers have at least one big inductor and at least one big filter capacitor, while linear mode amplifiers normally do not. In the switching amplifiers, the filter capacitor is used to attenuate noise spikes generated by the switching actions of the output circuit, which generates large ripple currents in the output inductor. A well-known benefit of switch mode amplifiers is that they have high efficiency, which the linear amplifiers simply do not have since they typically are operated in their linear region.

In the telecommunications industry, network reliability is a very important characteristic which is much sought after. As more and more communications traffic and data flow across fiber-optic networks, the desire for long-term reliability has increased. Two of the main problems to be solved in this regard are: (a) the generation of heat through the operation of the laser diodes, the TECs and their associated lower efficiency controller/drivers; and (b) the larger power supply equipment needed to drive the TECs when using lower efficiency driving circuits and the larger heat removal equipment required to remove the excess heat that is produced by the driving circuits and this larger power supply equipment, and (c) the extra electrical energy consumed by the lower efficiency driving circuits, and the larger power supply equipment and larger heat removal equipment.

Therefore, it is a principal object of the present invention to provide a highly efficient H bridge regulating system for driving an electric load, such as a TEC, to thereby reduce electrical power required for driving the load. It is a related object to reduce the amount of heat and energy associated with operating and controlling a TEC or other electric load using an H bridge circuit. A further related object is to improve the reliability of the amplifiers and controllers used in H bridge drive systems by reducing the amount of heat generated during operation of the amplifiers and controllers.

It is another object to provide an H bridge regulating system for driving a two-wire (i.e., two-terminal) electric load, such as a TEC, by way of a linear amplifier and a switch mode amplifier connected, directly and simultaneously, to the opposite ends of the two-wire load. It is a related object to provide an H bridge regulating system that includes a linear amplifier stage and switching amplifier stage, and to provide a method for monitoring the outputs of both the linear amplifier and the switch mode amplifier simultaneously and controlling the outputs of both amplifiers in part based on one or more monitored conditions. A related object is to provide low-cost feedback circuits for implementing such monitoring and control functions.

Yet another object of the present invention is reduce the overall energy requirements needed to drive electric loads by providing a highly-efficient H-bridge circuit and method for doing so. A related object is reduce the amount of heating, and therefore the amount of air-conditioning and/or heat removal, that must be provided in electrical controller enclosures due to waste heat being generated across drive circuit components, particularly the power amplifier components and their associated power supplies.

SUMMARY OF THE INVENTION

In light of the foregoing objects, and in order to solve one or more of the foregoing problems, there is provided, according to a first aspect of the present invention, a novel H bridge regulating system for efficiently driving an electric load connected thereto through two terminal ends. The H bridge system comprises: a linear output stage and a switched output stage connected respectively to first and second opposite ends of an electric load. The linear output stage has a linear mode amplifier and a feedback circuit, preferably implemented with hard-wired components, which may respectively be called the first amplifier and the first feedback circuit. The feedback circuit preferably has at least a first conditioning element, which may be a resistor (R2). The linear mode amplifier generates an output signal (V1) at its first output, which is delivered directly to the first end of the electric load. The linear mode amplifier preferably has inverting and non-inverting inputs. A first feedback signal indicative of a first condition, such as a first output voltage (V1), relating to a condition (such as voltage) at the first end of the load preferably passes through the first conditioning element (R2) of the first feedback circuit to the inverting input of the linear mode amplifier.

In similar fashion, the switch mode output stage has a switch mode amplifier and feedback circuit, preferably implemented with hard-wired components, which may respectively be called the second amplifier and the second feedback circuit. The second feedback circuit preferably also has at least a first conditioning element, which may be a resistor (R4). The switch mode amplifier generates an output signal (V2) at its output, which may be called the second output, which is delivered to the second terminal end of the electric load. The switch mode amplifier preferably has inverting and non-inverting inputs. A second feedback signal indicative of a second condition, such as a second output voltage (V2), relating to a condition (such as voltage) at the second end of the load preferably passes through the first conditioning element (R4) of the second feedback circuit to the inverting input of the switch mode amplifier. A reference input signal, such as a command voltage (Vin), is preferably supplied to a non-inverting input of the linear mode amplifier, and is also supplied through a summing junction to the inverting input of the switch mode amplifier. The outputs from the linear mode amplifier and the switch mode amplifier are simultaneously applied to the electric load. Also, the voltage difference between those two outputs (V1 and V2), which translates to the voltage across the load (VLoad=V1−V2), is dictated by the reference input signal (Vin). This voltage across the load typically is some desired fraction of the total voltage between the positive and negative voltage supply rails (that is Vps and −Vps), as determined by the magnitude of the input signal, and may be negative or positive.

In the preferred embodiment, there are preferably further elements which form part of the first and second feedback circuits. In the first feedback circuit, there is preferably a second element, which may be a resistor (R1), for helping set the gain of the first amplifier. This second element (R1) is preferably tied to the ground, that is to a point midway between the power supply voltages Vps and −Vps provided to the first amplifier. In the second feedback circuit, there is preferably a second element, which may be a resistor (R6), connected to and helping establish a second input voltage applied to the non-inverting input of the second amplifier. The other side of this second element (R6) is also preferably tied to ground, that is to a point midway between the power supply voltages Vps and −Vps provided to the second amplifier. In the second feedback circuit, there is also preferably a third conditioning element, which may also be a resistor (R3), that connects the input command signal (Vin)

to the inverting input of the second or switching amplifier. In the second feedback circuit, there is also preferably a fourth conditioning element, which may also be a resistor (R5), that connects the first output (V1) to the non-inverting input of the switch mode amplifier.

As will be further explained below, the H bridge regulating system described above can, when proper ratios exist between the feedback circuit components, implement the classic H bridge transfer function across the load. Further, this system as described herein is of higher efficiency than conventional high-efficiency H bridges which use two switch mode output stages. Further, as will be explained below, as the gain of the linear amplifier is made large, the linear output stage will consume less power, resulting in a H bridge circuit that is higher in efficiency than one using two switch mode output stages.

This new H bridge system is of lower cost because one of the two switch mode output stages in the conventional design is replaced by a lower cost linear output stage. Also, the new system fits into a smaller package because of the use of the linear output stage, which takes less space to implement than the switch mode output stage it replaces.

The first output, that is the output of the linear mode amplifier, has three separate states, represented by left, central and right regions on the graphs. This will be further described below with respect to graphs of signal waveforms presented in FIGS. 3 and 4. The first and second output stages may operate between two power supply voltages, namely a positive supply voltage (Vps), which may be called the positive rail, and a negative supply voltage (–Vps), which may be called the negative rail. FIG. 3 shows the novel output stage waveforms and methods of the present invention in such an environment. In certain conventional H bridge circuit installations, it is common to omit one of the power supplies, for example, the negative power supply, to save cost, and simply tie the negative rail connections of the two identical output stages to ground. FIG. 4 shows the novel output stage waveforms and methods of the present invention in such an environment. Since the circuits and methods of the present invention readily work in both of these environments, it is convenient to give easy-to-remember names to the three separate states or regions of the linear amplifier's output as shown on the graphs. The left region can be called the "linear stage saturated to negative rail" region, the central region can be called the "linear stage at linear" region, and the right region can be called the "linear stage saturated to positive rail" region. For convenience, these left, central and right regions may sometimes be respectively also be called the "linear saturated to ground" region (especially for the FIG. 4 environment), the "linear-linear" region, and the "linear saturated to positive" region.

As shown in the graph of FIG. 3B, which illustrates the two power supplies environment, the first output, that is the output of the linear mode amplifier, is held at –Vps in the left region by saturating the lower half of the first amplifier, that is sinking the first output to the negative rail. As shown in the graph of FIG. 4A, which illustrates the one power supply environment with the negative rail being to ground, the output of the linear mode amplifier is held at ground potential, that is zero volts, in the left region by saturating the lower half of the first amplifier, that is sinking the first output to its negative rail, which is tied to ground. In the right region, as shown in both FIG. 3C and FIG. 4A, the output of the linear mode amplifier is held at the positive supply voltage or positive rail voltage in the right region—hence its name the "linear stage saturated to positive rail" region. This, of course, is accomplished by saturating the upper half of the first amplifier, which of course effectively ties the first output to the positive rail. In both environments, the central region on the graphs of FIGS. 3B and 4A, is called the "linear stage at linear" region, because the linear mode amplifier operates linearly when in this region. Typically, both the upper and lower halves of the first or linear amplifier are operating in their active, conducting but non-saturated portions of their transistor power curves.

As will be further explained, by making the gain K of the linear amplifier sufficiently high, the central or "linear-linear" region may be made quite small, such as less than one percent of the overall range of operation between the ground and positive rail. Thus, the average power efficiency of the linear output stage can be very high most of the time, since it generally will consume very little power most of time as it is saturated to either one of the power supply rails. In this regard, it is strongly preferred that, in the H bridge circuits of the present invention, linear amplifiers which have a low saturation voltage or a low saturation resistance be utilized, since they will consume less power when saturated. By operating the linear output stage in a saturated state 99% or more of the time, the H bridge circuits of the present invention achieve overall efficiencies higher than conventional H bridge circuits having two identical switch-mode output stages, even when they are of even the highest efficiency.

As will be further explained, it is the small size of the central region on the graph, relative to the overall size or range of H bridge output voltages on the graph, that helps make the efficiency of this new H bridge design even more efficient. Preferably, this central region represents less than about ten percent, and more preferably less than about five percent, and most preferably about one percent or less, of the total active range of operation comprised of the three regions together. Further, the central location of this central region on the graph is selected to minimize the voltage across the load when the H bridge circuit is in this region. Note that the power consumed by the linear mode amplifier in the "linear-linear" region is the product of the current times the voltage drop across that half of the linear mode amplifier that is conducting). The voltage across the load is very small in this region, for example less than 100 millivolts. Thus, the amount of current flowing through the load (such as a TEC) will also be very small, which yields very small power consumption. The power consumption is the product of the load current and the voltage drop (a) between the linear output and the positive power rail if the load current is positive (that is, if the current flows from the V1 end to the V2 end), or (b) between the linear output and the negative rail (which may, as noted above, be tied to ground in the one power supply environment). Thus, the linear amplifier generates very little waste heat, even in its active state. Accordingly, the linear amplifier stage of the present invention, in comparison to the usual arrangement of a conventional H bridge made of two linear amplifiers, requires (1) a much smaller heat sink, or (2) perhaps even no heat sink. Either way, this helps reduce the cost of constructing a commercially viable H bridge circuit based upon the present invention.

The foregoing objects and advantages of the H-bridge regulating system and method of the present invention, together with the structural characteristics and operational details thereof, which have been only briefly summarized in the foregoing passages. They will become more apparent to those skilled in the art upon reading the detailed description of the preferred embodiments which follows in this specification, together with the illustrations presented in the accompanying figures.

BRIEF DESCRIPTION OF THE DRAWINGS

FIG. 3B is a voltage graph of the output of the linear amplifier of FIG. 2 over time, as the FIG. 2 system responds to the input signal of FIG. 3A, and FIG. 3C is a voltage graph of the output of the switch mode amplifier of FIG 2, as the FIG 2, system responds to the input signal of FIG 3A.

FIGS. 4A and 4B shows signal wave forms as a function of Vinput (also called Vin) to help illustrate the operation of the FIG. 2 circuit when the negative supply is set to zero volts, where:

FIG. 4A shows the output voltages of the linear mode output stage and switch mode output stage superimposed upon one another as a function of Vinput, and FIG. 4B shows the voltage across the load to be driven by circuit 200 as a function of Vinput.

FIG. 5A shows the output voltages of the linear mode output stage and switch mode output stage superimposed upon one another as a function of Vinput, and FIG. 5B shows the voltage across the load as a function of Vinput and as determined by circuit 200' having such a smoothing function.

in FIG. 8A, the input signal is supplied to an inverting input of the signal processing/adder block of the switch mode stage, and in FIG. 8B, the input signal is supplied to a noninverting input of the signal processing/adder block of the switch mode stage.

DETAILED DESCRIPTION OF THE PREFERRED EMBODIMENTS

The following description of the preferred embodiments of the H bridge systems and methods of the present invention are merely exemplary in nature and are in no way intended to restrict the scope of the present invention, the manner in which various aspects of the invention can be implemented, or their applications or uses. For example, although the invention is first discussed with respect to resistive loads, it should be understood that the invention can also be used with electrical loads having one or more reactive components as well, including but not limited to motor loads, capacitive loads, and inductive loads.

Figure 1:
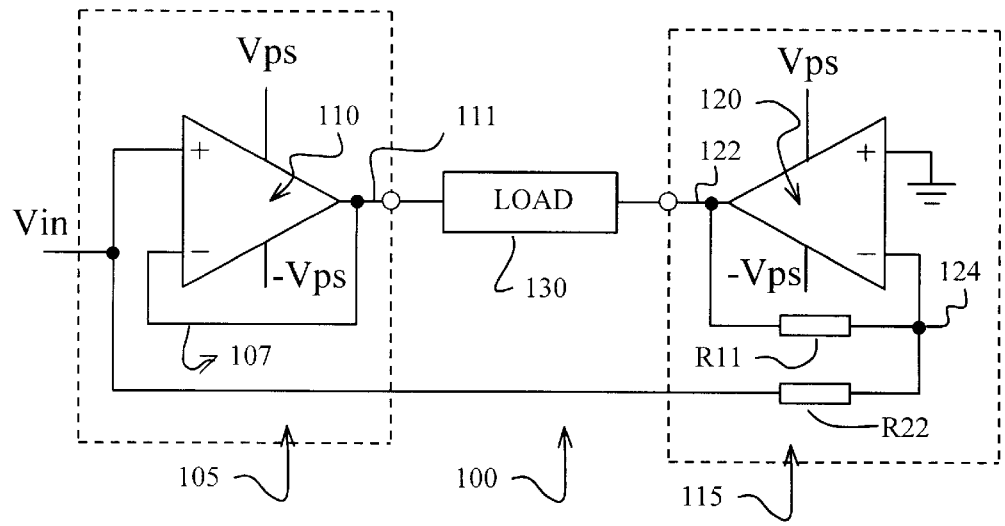
FIG. 1 is a schematic diagram of a conventional (prior art) high efficiency H bridge using two switch-mode output stages to drive an electric load, such as a TEC, positioned therebetween.

By way of introduction and laying out further background, FIG. 1 shows the basic construction of a prior art H bridge circuit 100 that uses two conventional output stages 105 and 115, each including an identical amplifier 110 or 120. These two amplifiers are each schematically shown as an operational amplifier having high-impedance inverting and non-inverting inputs and a single central or center-tapped output 111 or 122. The first output stage 105 includes a feedback circuit comprising of a conductor 107 running the first output 111 to the inverting input of amplifier 110. An input command signal Vin is supplied to the noninverting input of amplifier 110. The second output stage 115 also includes a feedback circuit comprised of conditioning elements R11 and R22, which preferably are resistors, connected as shown. Resistor R11 is connected at one end to the second output 122, and at the other end to inverting input of amplifier 120. Input command signal Vin is connected to the inverting input of amplifier 120 through element R22 as shown at node 124. Node 124 is a summing junction in that the relative strength of the signals reaching the inverting input of amplifier 120 is determined by the relative values of conditioning elements R11 and R22.

The amplifiers 110 and 120 can each be implemented using two power switching devices such as power bipolar junction transistors (BJTs), or such as power MOSFETs, in their output stages, and low power components, such as operational amplifiers, ASICs or other integrated circuit chip or hard-wired circuits for all other parts of the amplifiers. Each power BJT may be each implemented as a Darlington pair of transistors. The power switching devices in each amplifier are arranged in a conventional push-pull configuration. In other words, within each amplifier, the power BJTs or MOSFETs are arranged in series between the positive and negative power supply rails denoted as Vps and –Vps in FIG. 1. As is well known, the series pair of power BJTs or MOSFETs in amplifiers 110 and 120 are then each center-tapped. This provides first and second outputs 111 and 122 which are then each connected to opposite ones of the two wires of electric load 130 as shown. Load 130 may be a TEC or any other kind of load. Using Kirchhoff's law, the current will flow through the load depending upon what the relative output (e.g., voltage) of the first amplifier 110 is to the output (e.g., voltage) of the second amplifier 120. The structure of the overall H-bridge circuit looks like an H when viewed at a distance, hence its name.

Typically, these operational amplifiers have at times been linear amplifiers. But such linear amplifiers have low efficiency. When used in an H bridge configuration to actively and continuously drive a load, such as a TEC, linear amplifiers are often 20% to 40% efficient at most. To avoid this low efficiency, it also has been a common practice to build the two amplifiers 110 and 120 as switch mode amplifiers, which are also fairly represented by generalized diagram of FIG. 1. In this manner, much higher efficiency H bridge TEC controllers are achieved. This approach has been successful to a large degree. Switch mode amplifiers are naturally very efficient, and waste much less energy and as a result produce less heat. The typical efficiency of a switch mode amplifier is about 90%. Accordingly, in a H bridge driving circuit, with the two switching amplifiers losing only about 10% of the applied power to heat, the total loss is about 20%. This means an H bridge TEC controller using two switch mode amplifier is about 80% efficient.

While 80% efficiency is impressive, switching amplifier circuits are more expensive, as has long been known. Also there are still excess heat problems when multiple TEC devices and their associated H bridge controllers and power supplies are concentrated in significant numbers in fiber optic network installations, as has been noted above. Even 20% electrical power losses to heat add up, and increase the cost of operating electrical equipment, especially when the energy required to run cooling equipment to remove the heat is factored in. Thus, as explained before, there is still a need to achieve still higher efficiencies to reduce the amount of electrical power lost and to minimize waste heat in such installations, and to reduce the cost of the H bridge itself. The H bridge circuits and methods of the present invention as described below and illustrated in the remaining Figures address these needs in an effective way.

Figure 2:
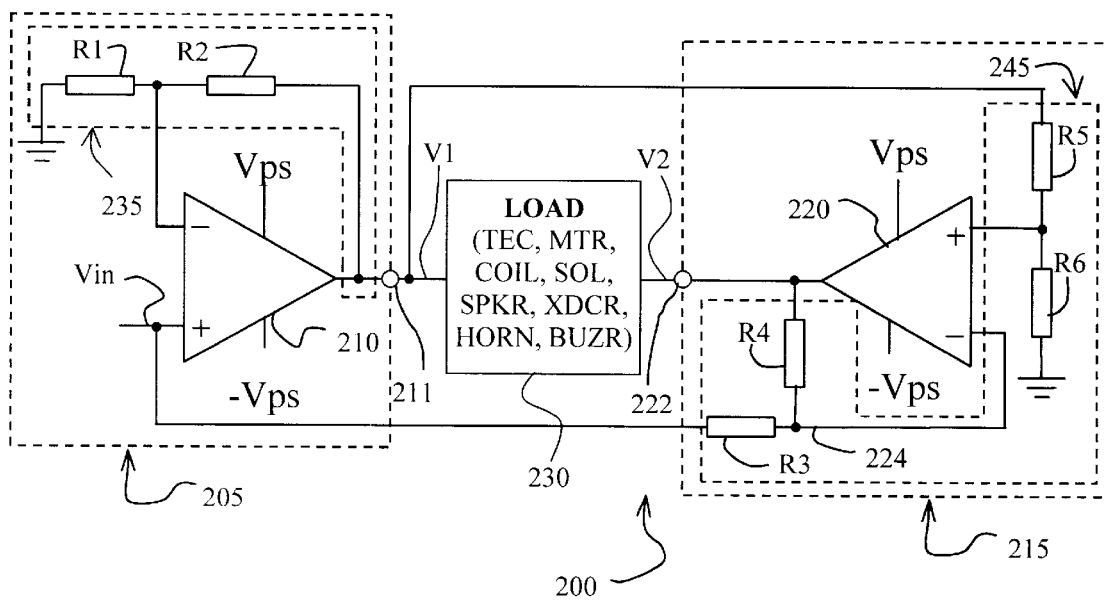
FIG. 2 is an embodiment of the present invention for a high efficiency H bridge system using one linear output stage and one switch mode output stage.

FIG. 2 shows an H bridge circuit 200 of the present invention. Circuit 200 includes linear mode output stage 205 having a conventional linear mode amplifier 210 and a switch mode output stage 215 having a conventional switch mode amplifier 220, with a load 230 connected to the outputs of amplifiers 210 and 220. It should be appreciated by those of ordinary skill in the art that, as shown in FIG. 2, the bridge circuit 200 can be used to drive a load 230 that may be any one of a variety of electrical or electronic devices, including but not limited to a thermoelectric cooler (TEC), an electric motor (MTR), a coil motor or a relay coil (COIL), a solenoid (SOL), an audio speaker (SPKR), an ultrasound transducer (XDCR), a horn or a buzzer (BUZR). Both amplifiers have inverting and noninverting inputs as shown, and these input are preferably high impedance. In addition, the internal open-loop gain of these conventional amplifiers 210 and 220 are both very high, preferably in excess of 10,000, more preferably in excess of 100,000 and even up to 1,000,000 or more. In comparison to the conventional H bridge embodiments described in connection to FIG. 1, one of the conventional switch mode amplifiers has been replaced with a lower-efficiency conventional linear mode amplifier. This of course, seems like a step backwards, since one would expect the efficiency to be worse. This would be true if the two amplifiers 210 and 220 were used conventionally. However, they are not, since this invention includes a novel method of simultaneously operating the two amplifiers to work together with unexpected higher efficiency than conventional methods. This novel method will be explained in detail shortly with reference to the graphs.

In its simplest hard-wired form, the novel method of operation is implemented using first and second feedback circuits 235 and 245 which are respectively parts of the first and second output stages 205 and 215. The novel feedback circuit 235 of linear mode output stage 205 is preferably constructed and hard-wired as shown in the FIG. 2 embodiment, in order to implement a first special transfer function for the linear output stage 205. Similarly, the novel feedback circuit 245 of switch mode output stage 215 is preferably constructed and hard-wired as shown in the FIG. 2 embodiment, in order to implement a second special transfer function for switch mode output stage 215, which is much different than the first transfer function. Feedback circuit 235 preferably includes conditioning elements R1 and R2, which may be resistors, connected as shown. Feedback circuit 245 includes conditioning elements R3, R4, R5 and R6, which are preferably resistors connected as shown.

In operation, linear mode amplifier 210 generates a first output signal V1, which is passed through resistor R2 of feedback circuit 235 and is fed back to the inverting input of amplifier 210. The gain K of amplifier 210 is set by the resistor ratio according to the following formula: 1+R2/R1. The other side of resistor R1 is tied to ground. In the FIG. 2 construction, ground is midway between the positive and negative supplies voltages Vps and −Vps.

In operation, switch mode amplifier 220 generates a second output signal V2, which is passed through element R4 of feedback circuit 245 and is fed back to an inverting input of amplifier 220. The input command signal Vin is fed forward in part through the resistor R3 to the inverting input of switch mode amplifier 220. Since one end of elements R3 and R4 are tied together this inverting input, which has also been marked as node 224, the input command signal Vin, which passes through resistor R3, is summed with output V2, which passes through resistor R4. Thus, node 224 is a summing junction. Another element R5 is connected at one end thereof to the non-inverting input of switch mode amplifier 220 and at the other end thereof to the first output V1. One end of element R6 is connected to the same noninverting input of amplifier 220, and the other end of element R6 is connected to ground as shown. Thus, the ratio R6/(R5+R6) determines what fraction of the first output signal V1 arrives at this non-inverting input of second amplifier 220. Accordingly, switching amplifier 220 will amplify, in real time, the difference in instantaneous voltages between V1 and Vin. The overall gain of linear mode amplifier 220 is set using conventional techniques to achieve the special transfer function described below for amplifier 220.

As will be explained further with respect to FIG. 3, the foregoing arrangement of first and second feedback circuits 235 and 245 in combination with linear mode amplifier 210 and switch mode amplifier 220 results in two distinctly different three-part-or-three-region transfer functions being implemented for outputs V1 and V2 as a function of the input signal Vin. Moreover, the resulting differential signal VLoad applied across the load 230, where VLoad=V1−V2, is linear (or substantially linear) with respect to the input signal Vin. It is a principal characteristic of the present invention that the outputs V1 and V2 from both linear mode amplifier 210 and switch mode amplifier 260 are simultaneously applied to load 230 of the system to achieve this net linear response, preferably across substantially the full range of the power supply voltages Vps to −Vps, or across substantially the full range of the single supply voltage Vps to ground, when the one power supply configuration represented by FIG. 4 is used).

In addition, linear mode amplifier 210 is normally operated either at Vps volts (saturated full on) or at −Vps (saturated or shorted to −Vps). In these two saturated modes of operation are shown as the left and right regions 256 and 257 as shown in FIG. 3B. When operating in these regions, linear mode amplifier 210 is extremely efficient and wastes virtually no energy. There is virtually no voltage drop internally across the saturated active solid-state power device, and thus it generates virtually no heat. As will be further explained, there is an extremely small central region 257, between these two saturated regions where the linear mode amplifier 210 is operated linearly. For reasons that have already been explained, the total energy wasted by amplifier 210 when amplifier 210 operates in this region is very small.

Switch mode amplifier 220 operates internally in a conventional manner. Amplifier 220 may use pulse width modulation (PWM) or Delta-Omega modulation or any other suitable type of switch mode amplifier modulation to achieve an average instantaneous voltage anywhere from Vps to −Vps, as desired or commanded by the signals present on its two inputs. Thus, the overall H bridge control circuit 200 can provide any particular voltage or any particular desired current flow across load 230 (which may be a TEC) by controlling whether or not the linear mode amplifier is at +Vps volts, thus acting as a current source, or at −Vps volts, thus acting as a current sink, and providing the appropriate desired output (such as a voltage V2) at output 112 of switching amplifiers 220. The central linear region 257 ensures a smooth transition between the two opposite saturation regions 256 and 258 for the linear mode amplifier.

When the linear amplifier is saturated, it has virtually no voltage drop across its power output common, and thus generates virtually no heat. When in saturation, the linear amplifier's efficiency approaches 100%. When the input voltage is slightly negative, the output of the linear mode amplifier will essentially be at the negative rail voltage (which will be zero volts, in the one power supply environment) since the amplifier has high gain. When the input signal is slightly positive, the output of the linear mode amplifier will be at +Vps (e.g., the positive supply voltage), again since the amplifier has high gain. Unfortunately, this very low level of input signal means that the linear mode amplifier is highly susceptible to electrical noise. If the input signal should accidentally vary between positive and negative, even for a very small period of time, then there will be a problem with inadvertent flipping of the output of the linear mode amplifier, which is very undesirable, since this would result in a temporary undesired current flowing through the TEC device. In order to overcome the problem of creating abrupt transient changes in the output 211 of linear stage 205, namely the flipping of the output from one rail to the other, a feedback circuit 235, as described above, is employed. Circuit 235 lowers the closed-loop voltage gain V1/Vin of linear mode output stage 205 to have a very stable and definite value, that is, V1/Vin=1+R2/R1. Accordingly, the output signal V1 is now stable and is linearly related to the input voltage Vin as follows: V1=(1+R2/R1)×Vin. Of course, as shown in the graphs of FIGS. 3B and 4A, the output V1 is linear according to this formula only in the central region represented by line segment 257, and is clamped in the left and right regions, as shown by line segments 256 and 258, to the voltage levels of the negative supply rail and positive supply rail respectively.

In this circuit 200, the various relationships can be expressed mathematically as follows:

$$V1 = Vin \times (1 + R2/R1) = K \times Vin,$$

where K=1+R2/R1, is defined as the voltage gain of the linear output stage in FIG. 2.

$$V2 = V1 \times R6/(R5+R6) \times (R3+R4)/R3 - Vin \times R4/R3 = K \times Vin \times R6/(R5+R6) \times (R3+R4)/R3 - Vin \times R4/R3,$$

define the voltage across the load: Vload=V1−V2

$$Vload = K \times Vin - K \times Vin \times R6/(R5+R6) \times (R3+R4)/R3 + Vin \times R4/R3, = Vin \times \{K \times [1 - R6/(R5+R6) \times (R3+R4)R3] + R4/R3\},$$

set $R6/(R5+R6) \times (R3+R4)/R3 = 1$, $$Vload = R4/R3 \times Vin.$$

To simplify the calculation, we can set R4/R3=2, $$Vload = 2 \times Vin,$$

the voltage across the load is then proportional to the input voltage, resulting in the required overall transfer function of an H bridge.

To achieve high efficiency, set the voltage gain of the linear output stage high enough, $$K = 1 + R2/R1 > 5,$$

the signal waveforms of the circuit will become as shown in FIG. 3. To calculate the efficiency, for a pure resistance load with the resistance of Rload, the output current is:

$$Iload = Vload/Rload = 2 \times Vin/Rload.$$

Assuming the linear stage has negligible saturation voltage which is often true in practice, it only consumes power during the period from T1 to T2, where:

$$V1(T1) = -Vps \text{ and } V1\ (T2) = Vps \text{ respectively, and}$$

$$Vin(T1) = V1(T1)/K \text{ and } Vin\ (T2) = V1(T2)/K \text{ respectively,}$$

$$Vload(T1) = 2 \times Vin(T1) = 2 \times V1(T1)/K = -2 \times Vps/K \text{ and}$$

$$Vload(T2) = 2 \times Vin(T2) = 2 \times V1(T2)/K = 2 \times Vps/K \text{ respectively.}$$

In this period, the load current changes linearly with time from $$Iload(T1) = Vload(T1)/Rload = -2 \times Vps/K/Rload \text{ to}$$

$$Iload(T2) = Vload(T2)/Rload = 2 \times Vps/K/Rload.$$

The load voltage changes linearly with time as well in this period.

Thus, the average power consumption by the linear output stage is $$Plinear = \int_{T1}^{Tc} Iload(t)[-Vps - Vload(t)]\,dt + \int_{Tc}^{T2} Iload(t)[Vps - Vload(t)]\,dt$$

and, the average power consumption between from T1 to Tc and from Tc to T2 are the same since the signals are symmetrical, $$Plinear = 2\int_{Tc}^{T2} Iload(t)[Vps - Vload(t)]\,dt$$

$$= 2\int_{Tc}^{T2} Iload(t)[Vps - Vload(t)]\,dt$$

$$= \frac{2}{KRload}\int_{o}^{1} 2Vps*t\left[Vps - \frac{2Vps*t}{K}\right]dt$$

$$= \frac{2Vps^2}{KRload} - \frac{8Vps^2}{3K^2 Rload} = \frac{2Vps^2}{KRload}\left(1 - \frac{4}{3K}\right).$$

As K approaching to a large number, the power consumption Plinear goes to zero. In practice, the power consumption Plinear can be less than 1% of the load power, resulting in a linear output stage having an efficiency of 99% or more, which is even higher than the highest efficiency switch-mode output stage. It should be noted that efficiencies of about 50% or more or 80% or more are very easily obtainable with the H bridge circuits of the present invention, such as by simply having K not be such a large number. The 80 percent efficiency rating should prove advantageous in comparison to H bridge circuits having two switch mode amplifiers that have also have about an 80% efficiency. This is because the H bridge circuits of the present invention, by employing one linear amplifier stage and only one switch mode amplifier, should still be less expensive than those having two switch mode amplifiers.

Figure 3A:
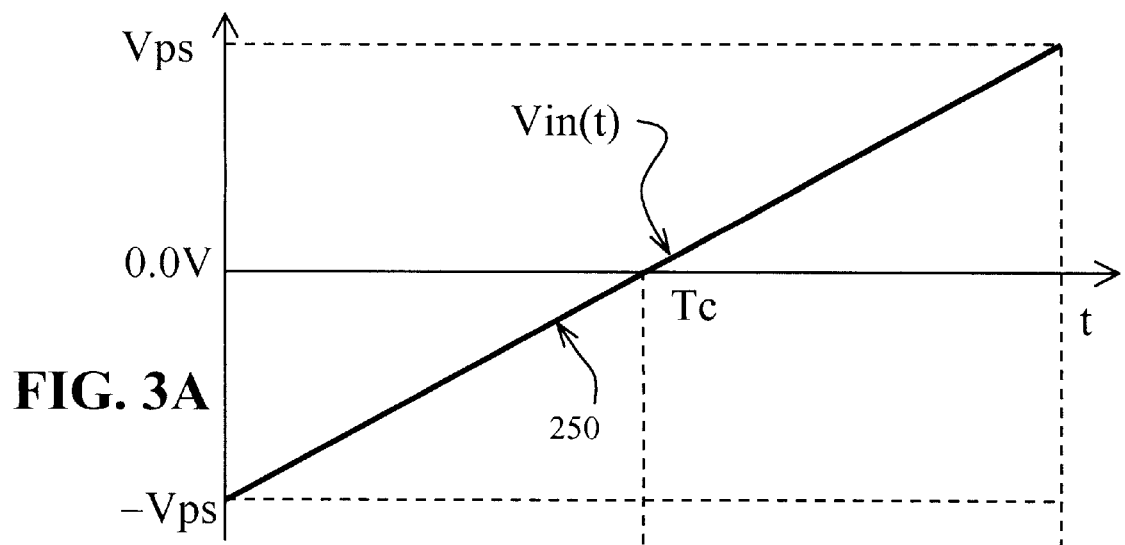
FIGS. 3A–3C show signal wave forms as a function of input voltage Vinput, which help explain the operation in the H bridge system of FIG. 2, where.
Figure 3B:
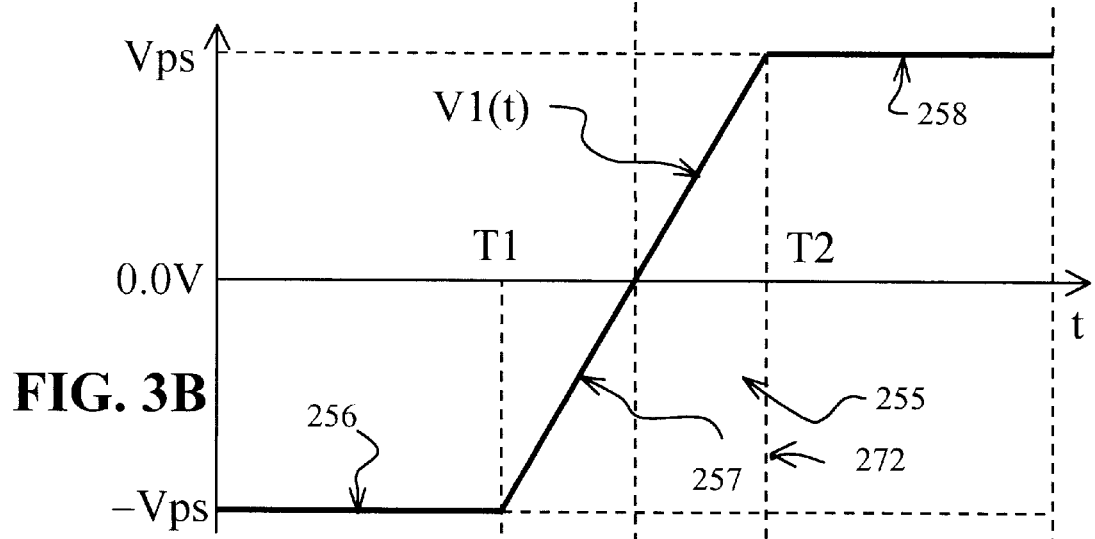
Figure 3C:
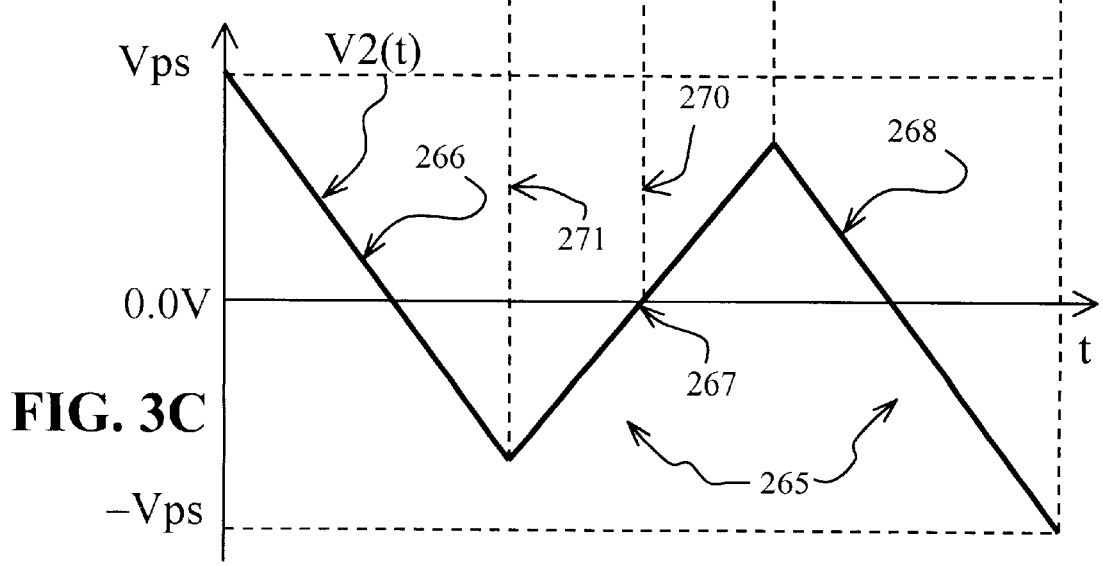

Turning now to FIGS. 3 and 4, the transfer functions of the two stages 205 and 215 of H bridge circuit 200 of the present invention will now be discussed with respect to three separate graphs of FIGS. 3A, 3B and 3C, which are all drawn along a common time line. The results of combining the two transfer functions of stages 205 and 215, which is done across load 230, are shown in FIGS. 4A and 4B. All of these graphs will now be explained. As will be seen, the H bridge circuit 200 of the present invention is a hybrid switch mode/linear mode amplifier system for linearly controlling a load in accordance with an input command signal Vin, and that it exhibits three distinct different regions of operation for each amplifier stage as will now be more fully described.

The upwardly sloping line 250 of FIG. 3A shows the input command signal Vin, which is preferably a voltage, as function of time. The three-part stepped line 255 of FIG. 3B represents the transfer function of linear stage 205, expressed by showing the output signal V1 of linear mode amplifier 210 as a function of time, showing how it changes as input signal Vin changes. The three-part zig-zag line 265 of FIG. 3C represents the transfer function of switching stage 215, expressed by showing the output signal V2 of switch mode amplifier 220 as a function of time, thus showing how it changes as input signal Vin changes.

FIG. 4A shows the graphs of FIGS. 3A and 3B overlaid on top of one another. The graphs of FIGS. 4A and 4B differ from those of FIG. 3 only in that, for FIGS. 4A and 4B, the negative supply rail is assumed to be at zero volts, and the horizontal coordinate is Vin. Note that the FIG. 2 circuit can arranged to operate in this environment simply by connecting the ends of resistors R1 and R6 to a voltage which is half the value of Vps, rather than connecting them to ground as shown in FIG. 2. Thus, it may be said that FIG. 4 shows the novel output stage waveforms and methods of the present invention operating in a one power supply environment. However, the observations made herein about the high-efficiency performance of circuit 200 all hold true regardless if the negative supply rail is at −Vps (by using two power supplies, Vps and −Vps) as shown in FIG. 3 or if it is zero volts as shown in FIG. 4 (by using only one power supply Vps, that is with −Vps tied to ground). Note that when circuit 200 is used for driving a TEC load using a 5 volt power supply, the negative supply rail would often be set up to equal zero volts, and Vps would of course be equal to +5.0 volts.) FIG. 4B shows a line 280 representing the output signal VLoad (where VLoad=V1−V2) across load 230 as a function of the input signal Vin, to show how it changes as the input signal Vin changes. As best shown in FIG. 4B, for a resistive load like a TEC, the switching between a load current flowing in the positive direction (that is from left to right through the load in FIG. 2) to the negative direction (from right to left) is made to occur at the midpoint 270, and between +Vps and −Vps, which is zero volts.

As most clearly seen in FIG. 3B, the output voltage V1 of the linear stage in the left region is at −Vps. This left region, represented by horizontal line segment 256 in FIG. 3B may be called the "linear stage saturated to negative rail" region. Or it may be called the "linear stage saturated to ground" as stated in FIG. 4A, because, as shown in the graph of FIG. 4A, line segment 256A is at zero volts in this region. This result is produced by saturating the lower half of linear amplifier 210 so that output 211 goes essentially to the negative supply rail voltage, which is −Vps in FIG. 3B and zero volts in FIG. 4A. This left region on the graphs ends at time T1.

As most clearly seen in FIG. 3C, the output voltage V2 at output 222 of switch mode stage 215 changes in response to changes in the input signal Vin. This changing output V2, represented by line 265, which has three distinct regions as well. In the left region, line segment 266 is shown to be monotonically decreasing with time, that is, as input signal Vin is increasing.

The central regions between T1 and T2 in the graphs of FIGS. 3B and 3C and FIG. 4A are called the "linear stage at linear" or "linear-linear" regions. In this region, both linear mode amplifier 210 and switch mode amplifier 220 are actively operating and respectively produce monotonically increasing straight line segments 257 and 267 in response to an increasing input Vin. As is explained elsewhere, the width of this region is actually a small percentage, preferably three to five percent, and more preferably one percent or less, of the overall range of output voltages of the two output stages of H bridge circuit 200.

The right region 268, located to the right of line T2, in the graphs of FIGS. 3B, 3C and 4A, may be called the "linear stage saturated to positive rail" region because linear mode amplifier 210 is saturated so that its output 211 is at the positive power supply rail, as shown by horizontal line segments 257 and 257A in FIGS. 3B and 4A. As to switch mode stage 215, its amplifier 220 produces signal V2 at output 222, as shown by line segments 267 and 267A in FIGS. 3C and 4A. In this right region, the switch mode output is monotonically decreasing as shown as input voltage Vin increases.

The voltage across load 230 may be called VLoad, where VLoad=V1−V2. VLoad is shown in FIG. 4B by linear line segment 280 to be monotonically increasing as a function of time and of the monotonically increasing input signal Vin. Specifically, a linear relationship exists between Vin and VLoad, as can be seen by comparing FIG. 3A with FIG. 4B. FIG. 4B shows that the result of combining the transfer functions of output stages 205 and 215 by taking their difference, which is what VLoad equals, is a sloping straight line. FIG. 4B also shows that the H bridge circuit 200 has the capability of driving the load 230 in either direction, that is, negatively (where $-Vps \leq VLoad \leq 0.0$ volts) as represented by line segment 281 beneath the zero point of FIG. 4B, or positively (where $0.0$ volts $\leq VLoad \leq Vps$ volts) as represented by line segment 282. Those in the art should appreciate that this result can readily be achieved even though Vin never goes below zero volts (that is, where $0.0$ volts $\leq Vin \leq Vps$).

Consider the situation, as depicted in FIG. 4, where the negative supply rail is at zero volts. In such a condition, the voltages V1 and V2 are at Vps/2 when the output VLoad is its central spot, as indicated by vertical line 270. In other words, both the linear output 211 and the switched output 222 are at Vps/2; therefore, the current through the TEC device will be zero, as suggested by FIG. 4B. Starting from this central point, the operation of H bridge circuit 200, in terms of what happens to VLoad and the current through load 230, will now be explained.

As the input signal Vin increases, the linear output V2 rises above Vps/2, and the switched output rises as well, but more slowly. Accordingly, the current through load 230 (e.g., a TEC) rises gradually (from left to right), in a linear relationship with the increasing voltage difference VLoad. At the point 272 where the linear output is saturated to the positive supply rail, the switched output V2 reverses direction and starts to go negative, thus resulting in a decreasing V2, which continues to increase the voltage differential VLoad across the load. In order for VLoad to exhibit a linear characteristic through the left, central and right regions, the circuit 200 provides for a specific relationship between the slopes in the central region and the slopes of V2 in the left and right regions. The slope of VLoad is equal to the slope of switched output V2 in the left and right regions. In the central region, the slope of VLoad is equal the difference between the slopes of outputs V1 and V2. In other words, the closed-loop gains of output stages 205 and 215 are selected such the slope or the rate of change of the voltage VLoad (where VLoad=V1−V2) in the central or "linear-to-linear" region will be equal to the slope of the output V2 of switch mode amplifier 215 in the left and right regions. This in turn ensures that a linear relationship exists between the input signal Vin and the combined output VLoad. In practice, the size of the "linear-to-linear" region is much smaller than shown in FIGS. 3 and 4. In other words, in practice, there are much steeper slopes in the central region for the linear output and switched output. Thus, the left and right regions are much larger, and the slope of the switched output is even more shallow than shown. It is preferred that extent of the central region for linear output stage 205 be the same as the central region for switched output stage 215. However, if strict linearity of the output VLoad is not required, then it need not be, but it is preferred to have it be close.

The trick to maximizing the efficiency of H bridge circuit 200 is to keep the central regions of amplifier stages 205 and 215 small, namely at only about 50 millivolts or less. This produces two benefits. First, this 50 millivolt range is the only region in which the linear mode amplifier is operating in the linear mode, which is its low efficiency condition. Fifty millivolts out of 5 volts (where Vps=5 volts, for example) represents only one percent of the total active range of the H bridge's operation of the load to be driven. Secondly, and most beneficially, when the power drawn from the power supply in the "linear-linear" region is the product of the current times the voltage. When the voltage differential is 50 millivolts or less, the amount of current flowing through the load (such as a TEC) is also very small. Most importantly, linear mode amplifier 210 generates very little heat, since it has such a small amount of current flowing through it as well.

The beauty of this method of having a very small "linear stage to linear" region and large left and right regions is as follows. First, controller 200 likely will very infrequently operate in this central zone, which is located right at Vps/2 (or 2.5 volts+/−25 millivolts, when Vps=5 volts). Secondly, when it does, the total amount of power passing through the TEC controller is very small. Third, as previously noted, the transitions are all very smooth, particularly with respect to the linear output. This is because the transition from the left region to the right region goes through the linear-to-linear region between points 271 and 272, where the input current is smoothly taken to zero and then goes positive so as to ensure there is no undesired and abrupt switching back and forth of the output signal V1 between the two power supply rail voltages. At present, the simple resistive circuitry which is employed in the feedback loops of the present invention coupled with the conventional internal circuitry of the present day conventional linear mode amplifiers and switch mode amplifier makes a range of the load voltage VLoad of 50 millivolts across the central "linear-to-linear" region practical. In the future, as better equipment is used or advances are made due to better components, the linear-to-linear region may become smaller, perhaps as small as five millivolts. This in turn would reduce still further the percentage of time the linear output stage 205 of H bridge circuit 200 would ever operate in this least efficient central region.

Also, observe that a midpoint, both the linear mode amplifier in FIG. 3A and the switch mode amplifier in FIG. 3B are in their active region. The linear mode amplifier is set up so that its rate of transition or slope is greater than the transition rate or slope for the switch mode amplifier. By carefully adjusting the rates (i.e., the slopes of lines 257 and 267) at which the outputs of the linear mode amplifier and the switch mode amplifier operate in this central region, including precisely where each transitions into the other regions, a desired glitch-free transition from a positive current flow to a negative current flow through the load is achieved. Since in the case of resistive loads like TECs, the amount of current flowing through the load is reportedly nearly proportional to the voltage, by differentially adjusting both the switch mode amplifier and linear mode amplifier, very fine adjustments of the TEC cooling capability can be achieved. This in turn ensures that a very precise control of the target temperature can be achieved over the entire range of the input signal Vin.

One of the beneficial aspects of the present invention, as described above, is that it uses the best features of both the switch mode amplifier and the linear mode amplifier. When high efficiency is required, the switch mode amplifier is available to do its job. Also, the linear mode amplifier operates in either the saturated-to-ground region or saturated-to-positive rail region, thus having high efficiency. When the linear operation of the linear mode amplifier is required, there is very low current, and very few components are required to achieve the linear mode operation desired across the 50 millivolt linear-linear region. To summarize, low-efficiency prior art TEC controllers use linear amplifier/linear amplifier H bridge configurations. Higher efficiency H bridge designs of the prior art use two switch mode amplifiers, which typically operate at 90% efficiency each, or 20% inefficiency when combined. The new design of the present invention reduces that power consumption effectively in half, since its linear mode amplifier is operating 99% of the time in the saturated region (saturated to ground or saturated to positive rail).

Figure 5A:
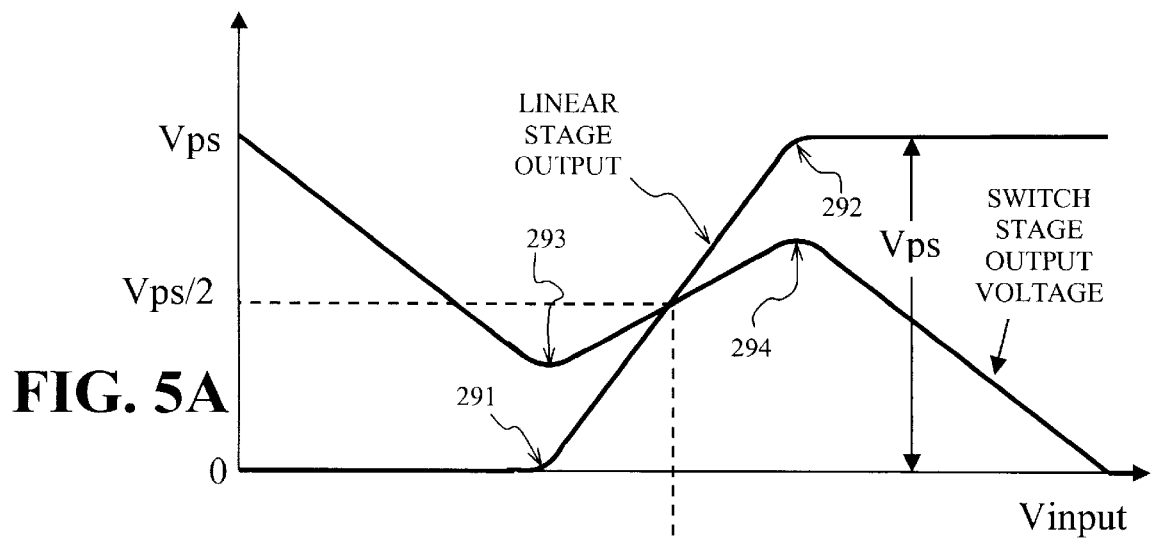
FIGS. 5A and 5B shows signal wave forms as a function of Vinput to help illustrate the operation of the FIG. 2 circuit when the corners between the three regions of the linear stage output signal are smoothed out, where.
Figure 5B:
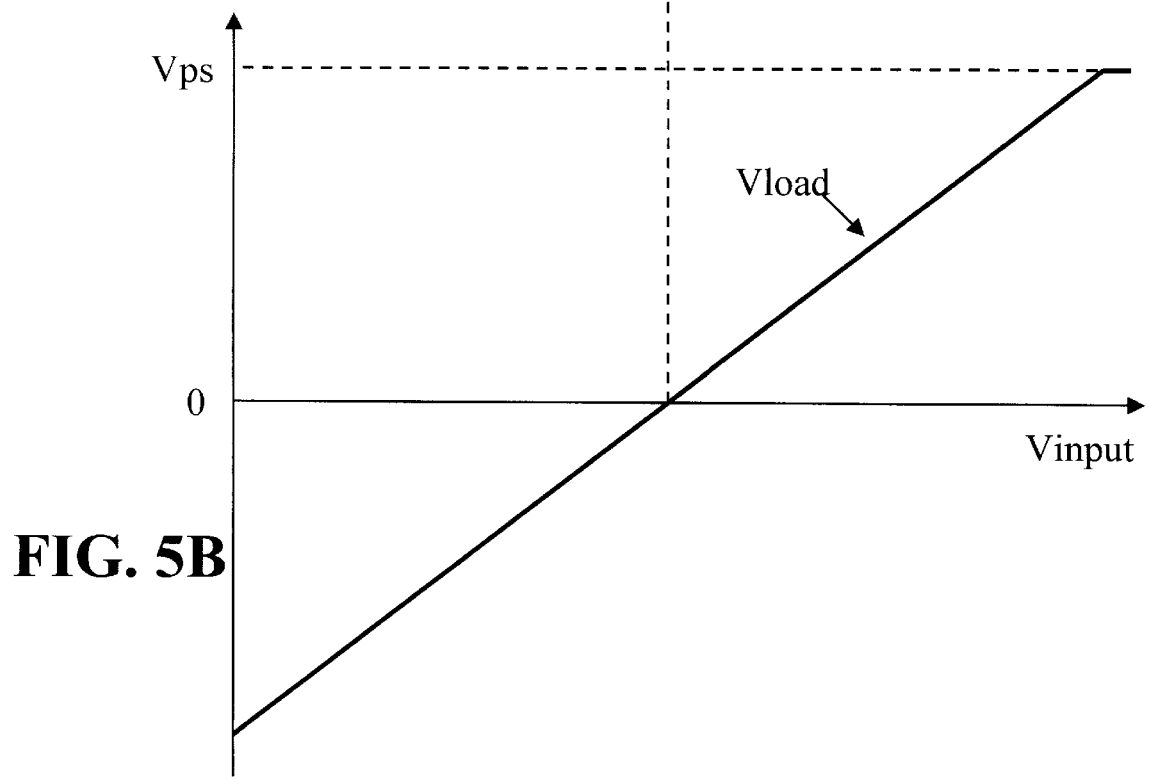

As illustrated in FIG. 5, another way of improving the overall system 200 for certain applications is to put a smoothing function into the linear output stage 205 at the corners between the three regions, as shown at locations 291 and 292 of FIG. 5A. When these corners are slightly rounded, which is easy to arrange electronically within amplifier 20 such as by using diodes, then switching amplifier 220 will also automatically exhibit a matching rounded characteristic. This is because feedback circuit 245 is arranged to monitor the output voltage V1 of amplifier 210 through conditioning element R5. Accordingly, the difference voltage across the non-inverting input is proportionally changed. Thus, the output signal V2 of amplifier 220 is proportionally changed, as is indicated by rounded corners 293 and 294. As a result, the signal across the load, VLoad, will still be linear as indicated in FIG. 5B. This rounding can bean important advantage in that the bandwidth required from the switch mode amplifier can be reduced. This in turn will reduce noise and lower distortion, and reduce circuit component cost. This may be particularly important for audio amplifier applications, since people are generally sensitive to audio noise and distortion. For TEC applications, it will not matter, since TECs operate at much lower frequencies.

Figure 6:
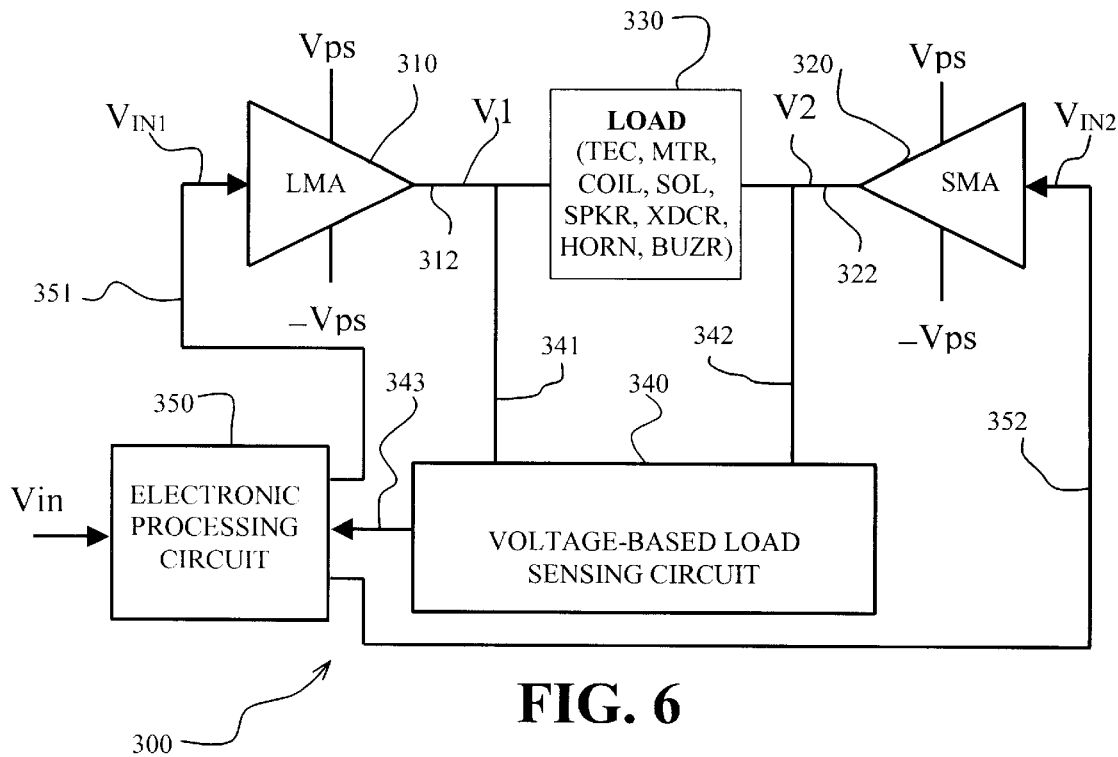
FIG. 6 shows a generalized H bridge controller system of the present invention in block diagram form, which system has a linear mode amplifier, switch mode amplifier, electronic processing circuit and a load sensing circuit which is voltage-based.

FIG. 6 shows that a system 300 of the present invention for implementing the transfer functions of FIGS. 3 and 4 or of FIG. 5 in a more generalized way than illustrated in FIG. 2. Circuit 200 of FIG. 2 employed hard wired feedback circuits comprised of resistive components that are particularly well suited for driving resistive loads. FIG. 6 is a generalized H bridge system for implementing desired transfer functions using more sophisticated general purpose or dedicated electronics as will now be described.

H bridge system 300 shown in FIG. 6 includes a linear mode amplifier 310 having output 311 and a switch mode amplifier 320 having output 322. electric load 330 is connected to and driven by the output signals V1 and V2 which are present at outputs 311 and 322. It should be appreciated by those of ordinary skill in the art that, as shown in FIG. 6, the bridge circuit 300 can be used to drive a load 330 that may be any one of a variety of electrical or electronic devices, including but not limited to a thermoelectric cooler (TEC), an electric motor (MTR), a coil motor or a relay coil (COIL), a solenoid (SOL), an audio speaker (SPKR), an ultrasound transducer (XDCR), a horn or a buzzer (BUZR). System 300 also includes a voltage-based load sensing circuit 340 and electronic processing circuit 350. Sensing circuit 340 monitors the voltage across the load 330 via conductors 341 and 342, and supplies a composite signal indicative of the monitored voltage across load 330 via signal path 343 to the electronic processing circuit 350. Amplifiers 310 and 320 are supplied by positive and negative voltage supplies indicated generaically as Vps and Vps. Electronic processing circuit 350 receives a commmand input signal Vin, and produces individual input command signals Vin 1 and Vin 2 over signal paths 351 and 352. Sensing circuit 340 alternatively may provide separate signals corresponding to output voltages V1 and V2 to processing circuit 350, and allow processing circuit 350 to compute the difference between them.

Voltage-based load sensing circuit 340 and electronic processing circuit 350 may be implemented using any suitable kind of electronic components. For example, an operational amplifier with inverting and noninverting inputs may receive the signals on conductors 341 and 342 on its high-impedance inputs, and produce a composite output signal which is sent to the electronic processing unit 350 on conductor 343. As a first alternative, the signals on conductors 341 and 342 may each be digitized by individual analog-to-digital converters, and the resulting digital values may be sent in digital format over signal path 343 to electronic processing circuit 350. Circuit 350 compares the value of the input command signal Vin against the achieved voltage across load 330, and generates appropriate individual command signals Vin1 and Vin2 which are sent respectively via conductors 351 and 352 to linear amplifier 310 and switching amplifier 320. The command signals may contain multiple signals or values, depending upon the implementation of the processing circuit 350 and the inputs amplifiers 310 and 320. The operation of circuit 350 preferably occurs in real time or at least fast enough to reliably drive and control the load for all needed purposes in its given application. Circuits 340 and 350 may take any suitable form, including application-specific integrated circuits, digital signal processing units utilizing calculations or one or more lookup tables, hardwired electronic analog circuits, or any other suitable form. Similarly, the input command signals passing through on conductors 351 and 352 may take any suitable form including digital signals, optical signals or analog signals.

The systems and methods of the present invention has been discussed thus far primarily with respect to resistive loads to be driven. It should be observed that system 300 shown in FIG. 6 can be used with reactive loads, particularly if the phase angles of the voltage signals are monitored.

Figure 7:
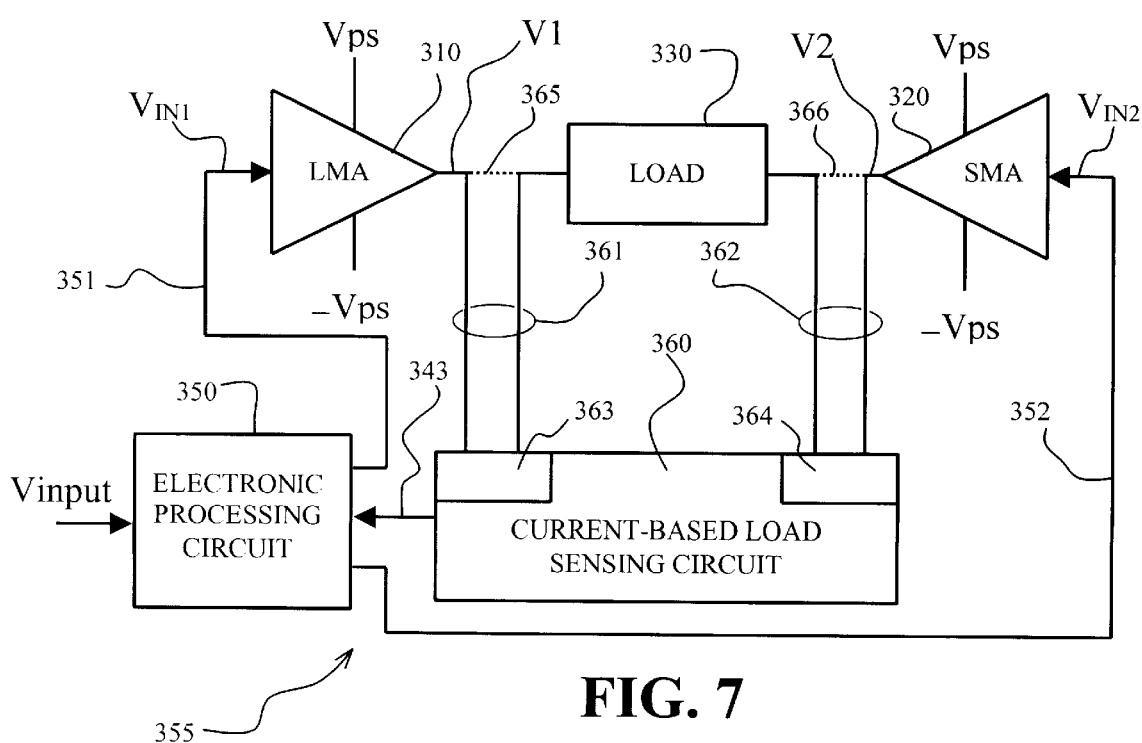
FIG. 7 shows an alternate H bridge controller system of the present invention in block diagram form which is the system of FIG. 6, except that the load sensing circuit is current-based, and can also sense the voltages at the load if desired.

FIG. 7 illustrates H bridge system 370 of the present invention that will work with such reactive loads, that is, with inductive or capacitive loads, with or without a resistive component. System 370 will also work with compound inductive/capacitive/resistive loads or other complex loads with one or more reactive and/or active components. System 370 is largely the same as system 300, except that voltage-based load sensing circuit has been replaced with current-based and/or voltage-based load sensing circuit 380. Any suitable technique may be utilized to sense current flowing into the left side of load 330 or into the right side of load 330, or both. Similarly, the voltage on one or both sides of load 330 may be sensed, as desired, in order to properly monitor and/or control the load.

When driving a reactive load, it is preferable that load current is sensed, instead of the load voltage, which was described above in circuit 200 for driving a pure resistive load like a TEC. The method of sensing the load current can also be used for the situation when driving a pure resistive load. Since, for a pure resistive load, the load voltage is proportional to the load current, without any phase delays, the method of sensing load voltage is presently preferred in practice, since it is generally less expensive to implement. However, as is well known, with loads having a reactive component, the phase relationships between the load voltage and the load current varies depending on the type of reactive load. As is well known, the load current of the purely capacitive load leads the load voltage by 90 degrees, and the load current of the purely inductive loads lags the load voltage by 90 degrees. When the load is composed of resistive, capacitive and/or inductive elements or components, the phase difference between the load voltage and the load current will not be exactly 90 degrees. Further, the phase angle will vary as the drive frequency changes, as is well-known, since the reactive components are frequency dependent. Under such circumstances, then, sensing the load current and/or the voltage at or across the load is highly desirable, so that the feedback circuit can make appropriate compensations for sensed changes in the load currents and/or voltages, whatever those changes may be, in order to optimize the desired control algorithm using conventional proportional-integral-derivative (P-I-D) linear control theory, feedback and associated techniques.

Figure 8A:
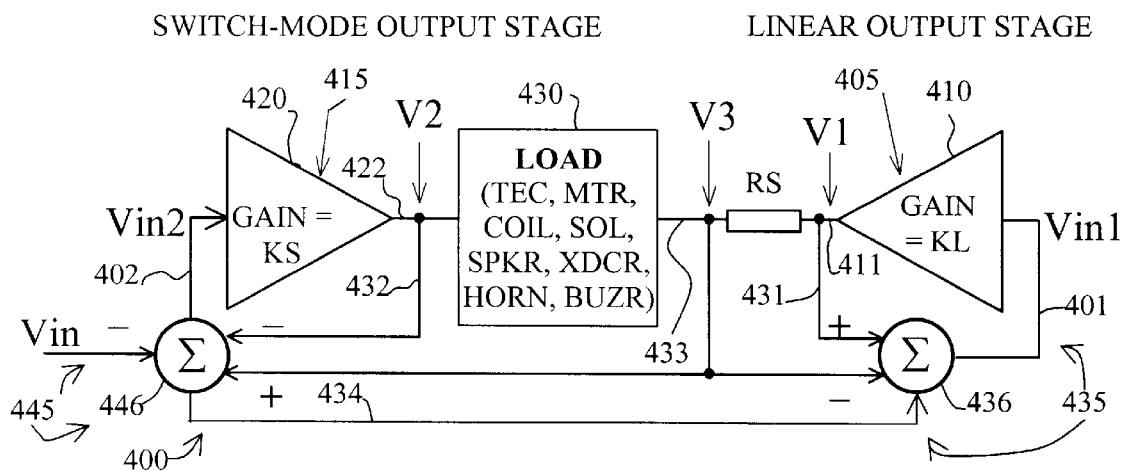
FIGS. 8A and 8B shows two variations of a generalized H bridge system of the present invention for driving a general complex two-terminal (two-wire) load having capacitive, inductive and/or resistive components, where each system includes a switch mode stage having a switch mode amplifier and a feedback circuit including an signal processing/adder block capable of monitoring both load voltage and load current values, a linear mode stage having a linear mode amplifier and a feedback circuit including a signal processing/adder block capable of monitoring both load voltage and load current values, and a load-current sensing element shown in series with the load, and where.

FIG. 8A shows two variation of a generalized H bridge system of the present invention for driving a general complex two-terminal (two-wire) load having capacitive, inductive and/or resistive components. H bridge system 400 shown in FIG. 8A includes a linear output stage 405 and a switch mode stage 415 which are used to drive an electric load 430 as shown. It should be appreciated by those of ordinary skill in the art that, as shown in FIG. 8A, the bridge circuit 400 can be used to drive a load 430 that may be any one of a variety of electrical or electronic devices, including but not limited to: a thermoelectric cooler (TEC), an electric motor (MTR), a coil motor or a relay coil (COIL), a solenoid (SOL), an audio speaker (SPKR), an ultrasound transducer (XDCR), a horn or a buzzer (BUZR). Linear output stage 405 includes linear amplifier 410 which internally has very high open loop gain. Stage 405 has an overall closed-loop gain KL, which is determined in part by a closed loop feedback circuit 435 which includes an signal processing/adder block 436. Amplifier 410 also has at least one input connected to conductor 401 which receives an input signal Vin1. Amplifier 415 has its output 411 connected to a shunt resistor RS, and the other side of shunt RS is connected via conductor 433 to load 430 shown.

Switch mode output stage 415 includes switch mode amplifier 420 which internally has very high open loop gain. Stage 415 has an overall closed-loop gain KS, which is determined in part by a closed loop feedback circuit 445 which includes an signal processing/adder block 446. Amplifier 420 also has at least one input connected to conductor 402 which receives the input signal Vin 2. Amplifier 420 has its output 422 connected to load 430.

Block 436 of feedback circuit 435 receives feedback signals V1 and V3 over conductors 431 and 433 and from those signals, and receives a command signal Vmod over conductor 444, derives input signal Vin1. Vmod is any suitable signal derived from the input command signal Vin to be delivered to block 436. It can the same as signal Vin, which is preferable, or it can be modified to suit any particular additional control strategy as desired. Signal V1 is the output signal from amplifier 410 and it is made available via conductor 431. Block 446 of feedback circuit 445 receives feedback signals V2 and V3 over conductors 432 and 433 and from those signals and the input command signal Vin, derives input signal Vin1. Signal V2 is the output signal from amplifier 420 and it is made available over conductor 433. Shunt resistor RS preferably has an extremely low resistor value relative to the impedance of load 430. The difference between signals V1 and V3 is linearly proportional to the current through load 430, and accordingly, this current information is available to block 436, which then, using any of the well-known linear feedback controls techniques, including any of those discussed in this specification, can adjust the input signal Vin1 on conductor 401 to drive linear amplifier 410 in a manner which implements the transfer function for the linear amplifier shown in FIGS. 3B and 4A. Similarly, given the input command signal information and feedback information made available to block 446, a suitable input signal Vin2 can be generated from of these signals by block 446 to properly drive the switch mode amplifier 420 to implement the transfer function for the switch mode amplifier shown in FIGS. 3C and 4A. In this manner, the energy efficiency advantages and benefits of the H bridge systems of the present invention are realized. The FIG. 8A embodiment also shows that the switch mode output stage 415 may be the primary feedback control section of the H bridge system of the present invention if desired.

Figure 8B:
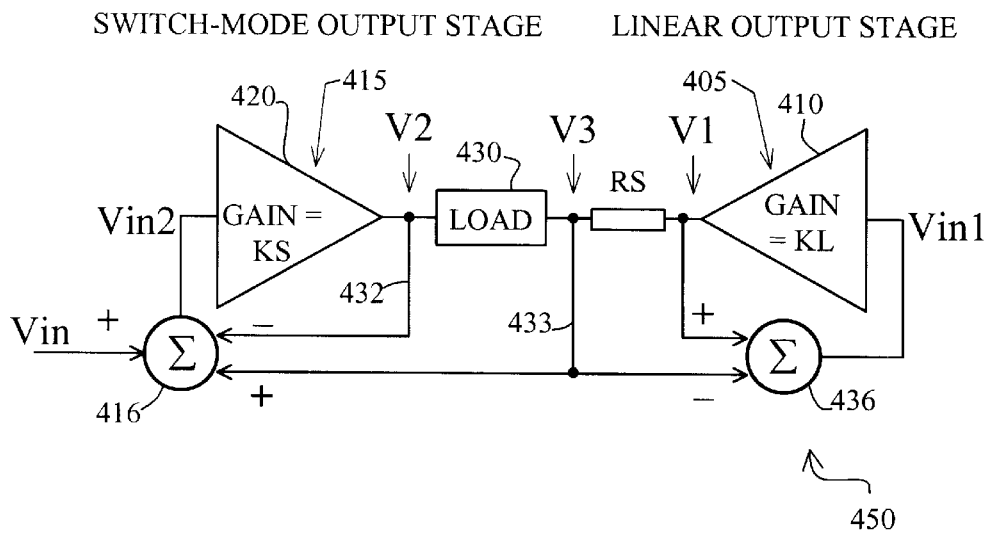

FIG. 8B shows an alternate generalized H bridge system 450 of the present invention for driving a two terminal load. This system 450 is identical in all respects to system 400 of FIG. 8A, except as follows. The command input Vin is shown to be supplied as a positive input to adder block 446 rather than a negative input as shown in FIG. 8A. in addition, the conductor of 434 of FIG. 8A. is not present. In reality, it is not necessary to provide the command input signal Vin to block 436. This is because desired value of output to the one of amplifier 410 can be derived by knowing the instantaneous current value and about relative voltage provided on conductor 433. In other words, those skilled in the art should appreciate that a control algorithm based upon the teachings of the present invention can be readily developed to implement the transfer functions for the linear mode output stage and switch mode output stage shown in FIGS. 3 and 4 using and H bridge system 450 shown in FIG. 8. In system 450, linear output stage 405 is essentially performing in a slave load with respect to switch mode output stage 415. Blocks 436 and 446 may be constructed using in any conventional or suitable electronic controls technology to accomplish the implementation of the desired transfer functions associated with output stage is 405 and 415, including hardware, application-specific integrated circuits, or electronic digital processors whose circuitry is controlled by firmware or a stored program resident and any suitable form of digital memory.

Figure 9:
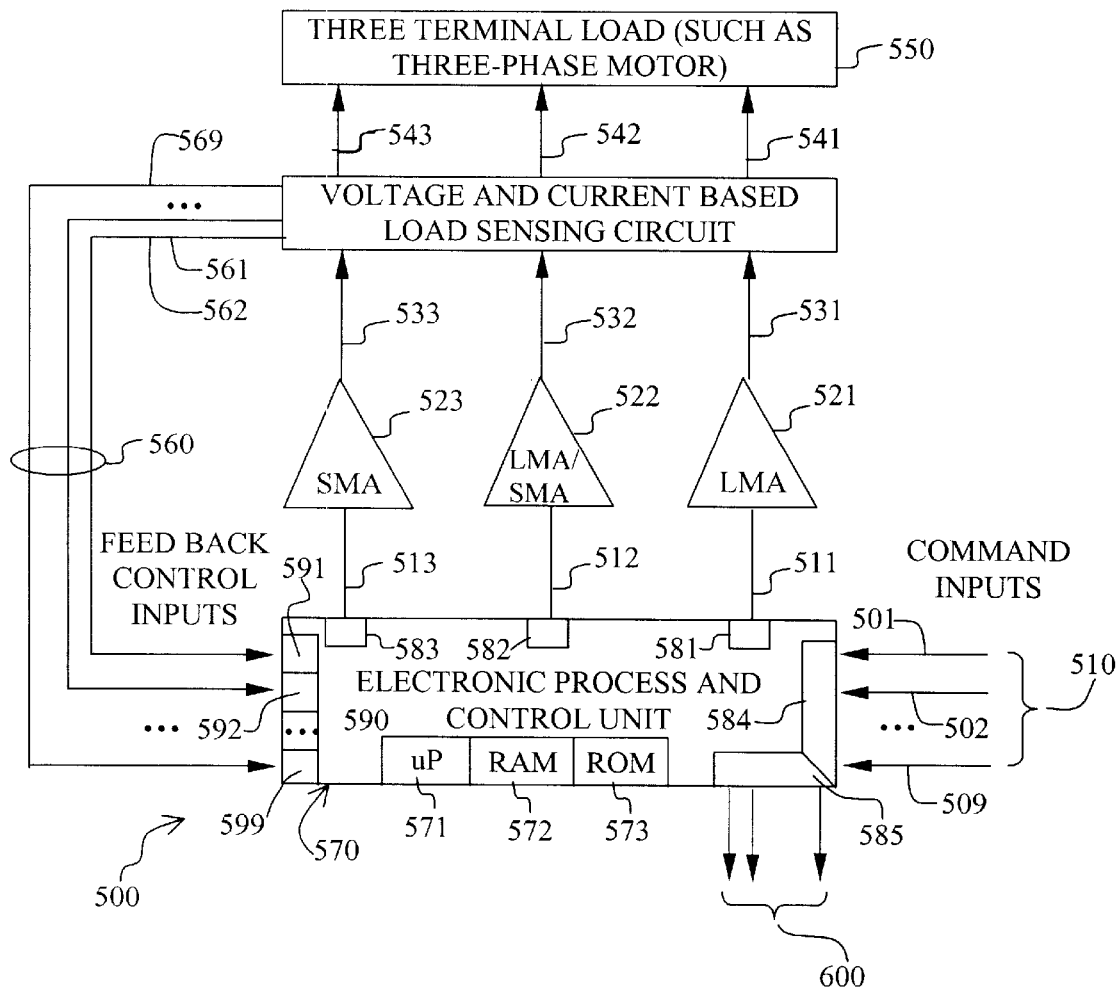
FIG. 9 shows a generalized H bridge system of the present invention for driving a general complex three-terminal load having capacitive, inductive and/or resistive components, such as a three-phase electric motor, where the system including two switch mode amplifiers and a linear mode amplifier feeding the three terminals through a voltage and current based load sensing circuit providing feedback to an electronic signal processing and control circuit that receives feedback signals from the sensing circuit and one or more input command signals, and produces individual input signals for driving three amplifiers.

FIG. 9 shows an H bridge system 500 of the present invention for driving a complex three terminal load 550, having capacitive, inductive and/or resistive components, such as a three-phase electric motor as shown. In the preferred embodiment, the H bridge system 500 includes a linear mode amplifier (LMA) 521, two switch mode amplifiers (SMAs) 522 and 523, load sensing circuits 540, and an electronic processing and control unit 570. As in the earlier embodiments, in system 500 may include sources of a positive voltage supply and a negative voltage supply to which the linear mode and switch mode amplifiers 521–523 are each connected. The switch and linear mode amplifiers 521, 522 and 523 feed the three terminal load 550 through the voltage and current based load sensing circuits 540 to provide feedback to the electronic processing and control unit 570. Electronic processing and control unit 570 receives a set 510 of command inputs in the form of one or more input command signals 501, 502 through 509, and along with the feedback signals from the sensing circuits 540, produces the signals to drive and control the amplifiers 521, 522 and 523.

More specifically, control unit 570 through its outputs 581, 582 and 583 delivers command signals 511, 512 and 513 to the inputs of amplifiers 521, 522 and 523 in turn, the outputs of amplifiers 521, 522 and 523 through lines 531, 532 and 533, are in electrical communication with load sensing circuits 540, which sense the load, based on voltage and/or current values, then pass the drive signals onto the load 550 through lines 541, 542 and 543. A set 560 of feedback control signals are delivered from load sensing circuits 540 through bus lines 561, 562 through 569 to connection points 591, 592 through 599 respectively, of input block 590 of the electronic processing and control unit 570, which may also be referred to as an electronic processing circuit. Unit 570, which microprocessor 571, random-access-memory (RAM) 572, and read-only-memory (ROM) 573 as well as various other know support circuitry to process the incoming set of command signals 510 that delivered through the inputs of input block 584. The electronic processing and control unit 570 also has an output block 585 that allows the unit to electronically communicate with other devices as necessary.

The linear mode amplifier 521 and switch mode amplifiers 522 and 523 are arranged in an H bridge configuration with the electric load 550. Load 550 may be a three-phase electrical device, such as a three-phase electric motor, Load sensing circuits 540 produce at least one and preferably at least two sensing output signals that provide information about sensed electrical conditions of the electric load to processing circuit 570. In operation, processing circuit 570 is arranged to utilize the sensing output signals provided on lines 560 from the load sensing circuit to help control the operation of linear 2 mode and switch mode amplifiers 521–523. Electronic processing circuit 570 is arranged to operate linear mode amplifier 521 in first, second and third regions, and the first and second switch mode amplifiers 522 and 523 in first, second and third regions, as will now be described.

As in the earlier embodiments driving a two terminal load, the first and third regions of operation of linear mode amplifier 521 are regions in which at least a portion of the linear mode amplifier is at least substantially saturated, and the second region of operation of the linear mode amplifier is a region in which the linear mode amplifier is operating linearly through a substantial portion of the second region. Also, switch mode amplifiers 522 and 523 are each arranged to be operable such that, in its first and third regions, the output signal of each switch mod amplifier is proportional to its input signal, and that in its second region, the output signal of each switch mode amplifier is proportional to the difference between the output signal of the linear mode amplifier and its input signal.

The system and advantages of the present invention can be implemented for driving a three terminal load 550 using either two SMAs and one LMA, or one SMA and two LMAs, as desired. Thus, in FIG. 9, amplifier 522 is properly depicted as being either a switch mode amplifier (SMA), which was described above, or it can be a linear mode amplifier (LMA), as will now be described. In general, those in the art shoals appreciate it is more expensive to substitute a linear mode amplifier for one of the switch mode amplifiers, but this can be done, if desired, within the scope of the present invention, as claimed below. In such a variation of the FIG. 9 embodiment, electronic processing circuit 570 is arranged to operate first and second linear mode amplifiers 521 and 522 in first, second and third regions, and switch mode amplifier 523 in first, second and third regions, as in the earlier embodiments. Further, in such a configuration, the first and third regions of operation of linear mode amplifiers 521 and 522 are each regions in which at least a portion of the respective linear mode amplifier is at least substantially saturated, and the second region of operation of the respective linear mode amplifier is a region in which the linear mode amplifier operates linearly through a substantial portion of that second region. As before the linear mode amplifiers 521 and 522 are each arranged to be operable such that, in its respective first region, the linear mode amplifier is at least substantially saturated to the negative voltage supply, and that in substantially all of its respective second region, the linear mode amplifier is operated linearly, and that in its third respective region, the linear mode amplifier is at least substantially saturated to the positive voltage supply. Similarly, switch mode amplifier 523 is still arranged to be operable such that, in its first and third regions, the output signal of SMA 523 is proportional to its input signal, and that in its second region, the output signal of SMA 523 is proportional to the difference between the output signal of at least one of the linear mode amplifiers and the input signal to SMA 523.

As previously discussed, the principles and designs for the H bridge systems, circuits and method of the present invention may also be effectively used for electric motor control and speaker control, and as drivers for proportional solenoids, homs and buzzers and in any other applications where a high efficiency design and differential outputs are desired. Thus, the circuits and methods of the present invention should not be considered to be restricted in their broader aspects to particular application such TEC controllers discussed in detail herein, but instead should be considered to be generalizable to all control and/or driver applications that can use the technological advances of the present invention. To summarize then, any controller or system which needs a pair of amplifiers or controllers in an H bridge configuration is a candidate for using the circuits and methods of the present invention. The H bridge amplifier circuits of the present invention can be used to provide finely controlled voltage or current signals which will flow both forward and backwards through any given kind of circuit element or load to achieve any desired operational result. For example, audio amplifiers can easily use this technology, since the switching speeds of the various circuit components utilized in conventional linear and switching amplifier designs are easily arranged to be far in excess of audio amplifier frequencies.

Also, all types of motor control application, which are of still lower frequency yet, can easily be addressed using the H bridge systems and methods of the present invention. Although the circuits and methods of the present invention have been described with respect to loads, including motors, having two terminal ends, they can also be readily adapted to three-phase and other multi-phase motors and loads using any conventional or suitable techniques. Further, the invention can readily be adapted to work with loads which operate at frequencies substantially higher than audio by simply ensuring that the speed of response of the amplifiers and the feed back control circuits and any signal processing units are suitabley fast enough for the speed of response required to operated the electric load to be controlled, including being fast enough for the highest frequencies than the desired signal waveforms to be applied by the H bridge circuits of the present invention to such a load. In this regard, those skilled in the art should appreciate that any conventional low-pass filtering technique and/or high-pass filtering technique can be readily employed in the amplifiers, feedback circuits and signal processing units of the present invention without departing from the spirit or scope of the present invention.

As used herein, including in the claims below, the term "terminal end" refers to the electric connection point for one end or part of an electric load, which may a wire, a screw or spade-type terminal, a conductive pad or block or any other type of electric connector. Thus, those skilled in the art should appreciate that the foregoing description and figures disclose and describe merely exemplary embodiments of H bridge systems and method of the present invention. One skilled in the art will readily recognize from such discussion, and from the accompanying drawings and claims, that various changes. modifications and variations may be made therein without departing from the spirit and scope of the present invention. For instance, although this invention has been discussed with respect to analog feedback circuits as shown in FIG. 2, those skilled in the art will recognize that a side range of digital controls and/or load sensing implementation may be utilized to provide appropriate individual command and/or feedback input signals to the linear mode amplifier and to the switch mode amplifier. For example, application-specific integrated circuits (ASICs) with passive and/or active components may be employed to implement the feedback circuits and/or significant portions of the circuitry employed in the power amplifier sections. Further, as discussed in connection with the embodiments of the present invention illustrated in FIGS. 5, 6 and 7, the various blocks shown therein may be implemented using hybrid circuits with analog-to-digital conversion of parameter values such as voltage, current or phase angles, and that the feedback function may be provided digitally using a microprocessor-based controller and/or digital signal processing (DSP) controllers operating under the control of firmware stored in any suitable form of digital memory. Most of the electronic signal processing can be done in the digital domain, using look-up tables or by calculating or by any other convenient form of digital computation to realize the transfer functions required for the desired operation of the linear mode amplifier and/or for the switch mode amplifier.

Further, any suitable form of undervoltage, overvoltage and/or overload protection may be added to any portion of the H bridge system as desired. For example, overload protection for the amplifiers to protect against shorted loads may be provided in any conventional or suitable way, including the foldback circuits, and may be implemented using analog or digital components, with ASICs or even digitally in software. Further, various forms of circuitry protection may be added for controlling and/or protecting against spikes induced by active loads such electric motors, solenoids or other inductors. The protection may take the form of inductors, bypass capacitor, flyback diodes, zener diodes and the like placed across or in series with the outputs of the upper and lower halves of the linear mode amplifier and/or the switch mode amplifier. Therefore, while this invention has been described in connection with particular examples thereof, the broad scope of the invention should not be so limited since the mentioned variations and still other modification will become apparent to the skilled practitioner upon a study of the figures, the text of this specification and the following claims.

I claim:

1. An H bridge regulating system for driving an electric load, the H bridge system comprising:
    a linear output stage, the linear output stage having a linear mode amplifier with inverting and non-inverting inputs and a feedback circuit with a first element, the amplifier generating a first output signal, the first output signal passing through the first element of the feedback circuit to the inverting input of the linear mode amplifier;
    a switch mode output stage, the switch mode output stage having a switch mode amplifier with inverting and non-inverting inputs and a feedback circuit with a first element, the switch mode amplifier generating a second output signal, the second output signal passing through the first element of the feedback circuit of the switch mode output stage to the inverting input of the switch mode amplifier, and wherein
    the outputs of the linear mode amplifier and the switch mode amplifier are simultaneously connectable to an electric load to be driven.

2. The H bridge regulating system as in claim 1, further comprising an electric load including at least one thermoelectric cooler connected to the outputs of the linear mode amplifier and the switch mode amplifier.

3. The H bridge regulating system as in claim 1, further comprising:
    an electric load being connected to the outputs of the linear mode amplifier and the switch mode amplifier, and wherein
    the electric load is selected from the group of electric loads consisting of electric motors, coil motors, relay coils, solenoids, audio speakers, ultrasound transducers, horns, buzzers, and thermoelectric coolers.

4. The H bridge regulating system as in claim 1, wherein:
    the feedback circuits of the linear mode output stage and the switch mode output stage each have at least a second element;
    the second element of the linear mode output stage is in electrical communication with the inverting input of the linear mode amplifier; and
    the second element of the switch mode output stage is in electrical communication with the non-inverting input of the switch mode amplifier.

5. The H bridge regulating system as in claim 4, further comprising an input to the H bridge system for receiving an input command signal, and wherein:
    the feedback circuit of the switch mode output stage has at least third and fourth elements,
    the third element of the switch mode output stage is in electrical communication with the inverting input of the switch mode amplifier and with the input for receiving the input command signal, and
    the fourth element of the switch mode output stage is in electrical communication with the non-inverting input of the switch mode amplifier and the output of the linear mode amplifier.

6. The H bridge regulating system of claim 5, wherein the feedback circuit of the switch mode output stage is arranged to provide electrical communication between the output of the switch mode amplifier and the input command signal, and between the output of the linear mode amplifier and the non-inverting input of the switch mode amplifier.

7. The H bridge regulating system of claim 1, wherein the switch mode amplifier uses pulse width modulation.

8. The H bridge regulating system of claim 1, wherein the switch mode amplifier uses switch mode modulation.

9. The H bridge regulating system as in claim 1, further comprising:
    a positive voltage supply and a negative voltage supply, with the linear mode amplifier and the switch mode amplifier each being connected to both the positive voltage supply and the negative voltage supply, and wherein
    the linear mode output stage is arranged such that the linear mode amplifier is operable in one of three regions depending upon a desired load current magnitude and direction, the first region having the linear mode amplifier being at least substantially fully saturated to the negative voltage supply, and the second region having the linear mode amplifier being operated linearly throughout at least most of the region, and the third region having the linear mode amplifier being at least substantially fully saturated to the positive voltage supply.

10. The H bridge regulating system as in claim 9, wherein the linear mode output stage and the switch mode output stage are arranged such that:

a changing input signal to the non-inverting input of the linear mode amplifier results in the output signal from the switch mode amplifier changing in the opposite direction when the linear mode amplifier is in its first and third regions, and a changing input signal to the non-inverting input of the linear mode amplifier results in the output signal from the switch mode amplifier changing in the same direction when the linear mode amplifier is in its second region.

11. The H bridge regulating system as in claim 9, wherein:

the gain of the linear mode amplifier is set such that the second region of the linear mode amplifier is sufficiently narrow to result in the linear mode amplifier having an efficiency greater than about eighty percent, whereby more than about 80 percent of the electrical power supplied to the linear mode amplifier is transferred to the electrical load.

12. The H bridge regulating system as in claim 1, further comprising:

an electric load connected to the outputs of the linear mode amplifier and the switch mode amplifier, and wherein the electric load includes a thermoelectric cooler, the feedback circuits of the linear mode output stage and the switch mode output stage each have at least a second element, the second element of the linear mode output stage is in electrical communication with the inverting input of the linear mode amplifier; and the second element of the switch mode output stage is in electrical communication with the non-inverting input of the switch mode amplifier.

13. The H bridge regulating system as in claim 12, wherein:

the feedback circuit of the switch mode output stage has at least third and fourth elements, the third element of the switch mode output stage is in electrical communication with the non-inverting input of the linear mode amplifier and the output of the switch mode amplifier through the first element of the switch mode output stage: and the fourth element of the switch mode output stage is in electrical communication with the non-inverting input of the switch mode amplifier and the output of the linear mode amplifier.

14. The H bridge regulating system as in claim 13, wherein all of the aforementioned elements of the feedback circuits of the linear mode output stage and the switch mode output stage are each substantially entirely resistive elements.

15. An electronic control system for driving an electric load having at least two terminals in a regulated manner, the control system including an H bridge arrangement for driving the electric load, the electronic control system comprising:

a linear mode amplifier having an input and having the output electrically connectable to the first terminal end of the electric load to be drive;

a switch mode amplifier having an input and having an output, the output being electrically connectable to the second terminal end of the electric load to be driven;

a load sensing circuit electrically connectable to the first and second terminal ends of the electric load to be driven, the load sensing circuit having at least one sensing output signal for providing information about at least one sensed electrical condition of the electric load;

an electronic processing circuit having first and second inputs and first and second outputs, the first input being for receiving a master input command signal, the second input being for receiving the sensing output signal of the load sensing circuit, the first and second outputs being for providing first and second input signals to the input of the linear mode amplifier and to the input of the switch mode amplifier respectively, and wherein the linear mode amplifier and switch mode amplifier are arranged in an H bridge configuration with the electric load being electrically connectable between the outputs of the linear mode amplifier and the switch mode amplifier, and the electronic processing circuit is arranged to operate the linear mode amplifier in first, second and third regions of operation and the switch mode amplifier in first, second and third regions of operation, with the first and third regions of operation of the linear mode amplifier being regions in which at least a portion of the linear mode amplifier is at least substantially saturated, and with the second region of operation of the linear mode amplifier being a region in which the linear mode amplifier id operating linearly through a substantial portion of the second region.

16. The electronic control system of claim 15, wherein the linear mode amplifier has a closed-loop gain which is sufficient to provide a power efficiency for that amplifier of at least about 80 percent, whereby at least about 80 percent of the electrical power being supplied to the linear mode amplifier is passed therethrough to the electric load to be driven.

17. The electronic control system of claim 15, wherein the linear mode amplifier as arranged to have a closed-loop gain which is sufficient to provide a power efficiency for that amplifier of at least about 90 percent, whereby at least about 90 percent of the electrical power being supplied to the linear mode amplifier is passed therethrough to the electric load to be driven.

18. The electronic control system of claim 15, wherein the linear mode amplifier is arranged to have a closed-loop gain which is sufficient to provide a power efficiency for that amplifier of at least about 99 percent, whereby at least about 99 percent of the electrical power being supplied to the linear mode amplifier is passed therethrough to the electric load to be driven.

19. An electronic control system as in claim 18, further comprising the electric load to be driven, which load includes at least one thermoelectric cooler having first and second terminal ends connected to the outputs of the linear mode amplifier and the switch mode amplifier respectively.

20. The electronic control system of claim 15 wherein the switch mode amplifier is arranged such that, in its first and third regions, the output signal of the switch mode amplifier is proportional to the input command signal, and that in its second region, the output signal of the switch mode amplifier is proportional to the difference between the output signal of the linear mode amplifier and the input command signal.

21. The electronic control system of claim 15, further comprising:
    an electric load having first and second terminal ends respectively connected to the outputs of the linear mode amplifier and the switch mode amplifier, the electric load being a thermoelectric cooler, and wherein the electronic processing circuit and the load sensing circuit are at least substantially comprised primarily of resistive elements.

22. The electronic control system of claim 15, further comprising an electric load having first and second terminal ends respectively connected to the outputs of the linear mode amplifier and the switch mode amplifier, the electric load being selected from the groups of electric loads consisting of electric motors, coil motors, relay coils, solenoids, audio speakers, ultrasound transducers, horns, buzzers, and thermoelectric coolers.

23. The electronic control system of claim 15, wherein the load sensing circuit senses a voltage across the load.

24. The electronic control system of claim 15, wherein the load sensing circuit senses a current flowing through the load.

25. The electronic control system of claim 15, wherein the load sensing circuit senses both a current flowing through the load and a voltage across the load.

26. The electronic control system of claim 15, wherein the load sensing circuit is arranged:
    (a) to sense in real time both a current associated with the load and a first voltage associated with the load, whereby information as to the phase angle relationship of the load current and the first voltage associated with the load is obtained, and
    (b) to pass along to the electronic processing unit at least periodically information as to the current and first voltage associated with the load, and as to the phase angle relationship therebetween.

27. The electronic control system of claim 15, wherein:
    the load sensing circuit is arranged to produce a first sensed signal associated with the current of the load, and the provide the first and second sensed signals to the electronic processing circuit.

28. An electronic control system as in claim 15, further comprising the electric load to be driven, which load includes at least one thermoelectric cooler having first and second terminal ends connected to the outputs of the linear mode amplifier and the switch mode amplifier respectively.

29. The electronic control system of claim 15, wherein:
    the system includes a positive voltage supply and a negative voltage supply, with the linear mode amplifier and the switch mode amplifier each being connected to both the positive voltage supply and the negative voltage supply, and
    the linear mode amplifier is arranged such that, in its first region, the linear mode amplifier is at least substantially saturated to the negative voltage supply, and that in substantially all of its second region, the linear mode amplifier is operated linearly, and that in its third region, the linear mode amplifier is at least substantially saturated to the positive voltage supply.

30. An electronic control system as in claim 29, further comprising the electric load to be driven, which load includes at least one thermoelectric cooler having first and second terminal ends connected to the outputs of the linear mode amplifier and the switch mode amplifier respectively.

31. A method of driving an electric load, using an H bridge system, in proportion to a value of an input command signal, the method comprising the steps of:
    (a) providing an H bridge system including first and second nodes for connecting an electric load to be driven thereto, the H bridge system having a linear mode amplifier and a switch mode amplifier, the linear mode amplifier being provided with an input and with an output which is connected to the first node, and the switch mode amplifier being provided with an input and with an output which is connected to the second node;
    (b) connecting an electric load having two opposed terminal ends to the first and second nodes;
    (c) providing an input command signal;
    (d) communicating a first input signal related to the input command signal to the input of the linear mode amplifier;
    (e) communicating a second input signal related to the input command signal to the input of the switch mode amplifier;
    (f) generating a first output signal at the output of the linear mode amplifier in response to the first input signal;
    (g) generating a second output signal at the output of the switch mode amplifier and
    (h) simultaneously applying the first and second output signals to the first and second nodes to drive the electric load, such that the difference between the first and second output signals across the load is substantially proportional to the input command signal over at least a substantial portion of the full range of the input command signal.

32. A method of driving an electric load using an H bridge system as in claim 28, wherein the second output signal in the second region of operation of the switch mode amplifier is proportional to a difference between a value associated with the first output signal and a value associated with the first input command signal.

33. A method of driving an electric load using an H bridge system as in claim 28, wherein the electric load is selected from the group of electrical loads consisting of electric motors, coil motors, relay coils, solenoids, audio speakers, ultrasound transducers, horns, buzzers, and thermoelectric coolers.

34. A method of driving an electric load as in claim 31, wherein in step (g), the switch mode amplifier operates substantially linearly in first, second and third distinct regions which are respectively associated with but are different from the first, second and third regions of the linear mode amplifier.

35. A method of driving an electric load using an H bridge system as in claim 31, wherein, in step (f), the linear mode amplifier:
    (1) operates in one of first, second and third regions, depending upon the value of the input command signal,
    (2) operates in opposite saturation states when in the first and third regions, and
    (3) operates substantially linearly in at least most of the second region, the second region being between the first and third regions, whereby the second region serves to smoothly transition the first output signal from a first saturation state associated with the first region to a second and opposite saturation state associated with the third region.

36. A method of driving an electric load using an H bridge system as in claim 35; wherein:
the first region of the linear mode amplifier is characterized by the output signal thereof being substantially clamped at a fist supply voltage;
the third region of the linear mode amplifier is characterized by the output signal thereof being substantially clamped at a second supply voltage which is different from the first supply voltage; and
the second region of the linear mode amplifier is characterized by the first output signal being a function that is dependent upon the load current.

37. An electronic control system including a H bridge arrangement for driving an electric load having three terminal ends, each of which are to be driven, the electronic control system comprising:
a linear mode amplifier having an input and having an output electrically connectable to the first terminal en of the electric load to be driven;
a first switch mode amplifier having an input and having an output the output being electrically connectable to the second terminal end of the electric load to be driven;
a second switch mode amplifier having an input and having an output, the output being electrically connectable to the third terminal end of the electric load to be driven;
a load sensing circuit having at least one sensing output signal for providing information about at least one sensed electrical condition of the electric load;
an electronic processing circuit having at least first and second inputs and first, second and third output, the first input being for receiving a master input command signal, the second input being for receiving the sensing output signal of the load sensing circuit, the first, second and third outputs being for providing first, second and third input signals to the input of the linear mode amplifier and to the inputs of the first and second switch mode amplifiers respectively, and wherein
the linear mode amplifier and switch mode amplifiers are arranged in an H bridge configuration with the electric load being electrically connectable between the outputs of the linear mode amplifier and the first and second switch mode amplifiers, and
the electronic processing circuit is arranged to operate the linear mode amplifier in first, second and third regions of operation, the first switch mode amplifier in first, second and third regions of operation, and the second switch mode amplifier in first, second and third regions of operation, with the first and third regions of operation of the linear mode amplifier being regions in which at least a portion of the linear mode amplifier is at least substantially saturated, and with the second region of operation of the linear mode amplifier being a region in which the linear mode amplifier is operating linearly through a substantial portion of the second region.

38. The electronic control system of claim 37 wherein the first and second switch mode amplifiers are each arranged to be operable such that, in its first and third regions, the output signal of each switch mode amplifier is proportional to its input signal, and that in its second region, the output signal of each switch mode amplifier is proportional to the difference between the output signal of the linear mode amplifier and its input signal.

39. An electronic control system as in claim 37 wherein:
the load sensing circuit is electrically connectable to at least two of the first, second and third terminal ends of the electric load to be driven,
the load sensing circuit is arranged to generate at least first and second sensing output signals for providing information about at least first and second sensed electrical conditions of the electric load, and
the electronic processing circuit further has at least a third input for receiving the second sensing output signal of the load sensing circuit, and
the electronic processing circuit further has at least a third input for receiving the second sensing output signal of the load sensing circuit, and
the electronic processing circuit is arranged to utilize the first and second sensing output signals from the load sensing circuit to help control the operation of the linear mode amplifier and the first and second switch mode amplifiers.

40. The electronic control system of claim 37, wherein:
the system includes a first source for connecting to positive voltage supply and a second source for connecting a negative voltage supply, with the linear mode amplifier and the first and second switch mode amplifiers each being connected to both the first source and the second source, and
the linear mode amplifier is arranged to be operable such that, in its first region, the linear mode amplifier is at least substantially saturated to the negative voltage supply, and that in substantially all of its second region the linear mode amplifier is operated linearly, and that in its third region, the linear mode amplifier is at least substantially saturated to the positive voltage supply.

41. An electronic control system as in claim 37, further comprising the electric load which is a three-phase electrical device.

42. An electronic control system as in claim 41, wherein the three-phase electrical device is a three-phase electric motor.

43. An electronic control system including a H bridge arrangement for driving an electric load having three terminal ends, each of which are to be driven, the electronic control system comprising:
a first linear mode amplifier having an input and having an output, the output being electrically connectable to the first terminal end of the electric load to be driven;
a second linear mod amplifier having an input and having an output, the output being electrically connectable to the second terminal end of the electric load to be driven;
a switch mode amplifier having an input and having an output, the output being electrically connectable to the third terminal end of the electric load to be driven;
a load sensing circuit having at least one sensing output signal for providing information about at least one sensed electrical condition of the electric load;
an electronic processing circuit having at least first and second inputs and first, second and third outputs, the first input being for receiving a master input command signal, the second input being for receiving the sensing output signal of the load sensing circuit, the first, second and third outputs being for providing first, second and third input signals to the inputs of the first and second linear mode amplifiers and to the input of the switch mode amplifier respectively, and wherein
the linear mode amplifiers and the switch mode amplifier are arranged in an H bridge configuration with the electric load being electrically connectable between the outputs of the first and second linear mode amplifiers and the switch mode amplifier, and the electronic processing circuit is arranged to operate the first and second linear mode amplifiers in first, second and third regions of operation, and the switch mode amplifier in first, second and third regions of operation, with the first and third regions of operation of the first and second linear mode amplifiers each being regions in which at least a portion of the respective linear mode amplifier is at least substantially saturated, and with the second region of operation of the respective linear mode amplifier being a region in which the linear mode amplifier is operating linearly through a substantial portion of the second region.

44. The electronic control system of claim 43 wherein the switch mode amplifier is arranged to be operable such that, in its first and third regions, the output signal of the switch mode amplifier is proportional to its input signal, and that in its second region, the output signal of the switch mode amplifier is proportional to the difference between the output signal of at least one of the linear mode amplifiers and the input signal to the switch mode amplifier.

45. An electronic control system as in claim 43 wherein:

the load sensing circuit is electrically connectable to at least two of the first, second and third terminal ends of the electric load to be driven, the load sensing circuit is arranged to generate at least first and second sensing output signals for providing information about at least first and second sensed electrical conditions of the electric load, and the electronic processing circuit further has at least a third input for receiving the second sensing output signal of the load sensing circuit, and the electronic processing circuit is arranged to utilize the first and second sensing output signals from the load sensing circuit to help control the operation of the first and second linear mode amplifiers and the switch mode amplifier.

46. The electronic control system of claim 43, wherein:

the system includes a first source for connecting to positive voltage supply and a second source for connecting a negative voltage supply, with the first and second linear mode amplifiers and the switch mode amplifier each being connected to both the first source and the second source, and the linear mode amplifiers are each arranged to be operable such that, in its respective first region, each linear mode amplifier is at least substantially saturated to the negative voltage supply, and that in substantially all of its respective second region, each linear mode amplifier is operated inearly, and that in its third respective region, each linear mod amplifier is at least substantially saturated to the positive voltage supply.

47. An electronic control system as in claim 43, further comprising the electric load which is a three-phase electrical device.

48. An electronic control system as in claim 43, wherein the three-phase electrical device is a three-phase electric motor.

* * * * *